United States Patent
Yu et al.

(10) Patent No.: US 12,107,064 B2
(45) Date of Patent: Oct. 1, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Jen-Jui Yu, Taipei (TW); Chih-Chiang Tsao, Taoyuan (TW); Hsuan-Ting Kuo, Taichung (TW); Mao-Yen Chang, Kaohsiung (TW); Hsiu-Jen Lin, Hsinchu County (TW); Ching-Hua Hsieh, Hsinchu (TW); Hao-Jan Pei, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 178 days.

(21) Appl. No.: 17/719,390

(22) Filed: Apr. 13, 2022

(65) Prior Publication Data

US 2023/0335523 A1 Oct. 19, 2023

(51) Int. Cl.
*H01L 23/00* (2006.01)
*H01L 23/367* (2006.01)
(Continued)

(52) U.S. Cl.
CPC ............ *H01L 24/16* (2013.01); *H01L 23/367* (2013.01); *H01L 23/49822* (2013.01);
(Continued)

(58) Field of Classification Search
CPC . H01L 24/16; H01L 23/367; H01L 23/49822; H01L 24/13; H01L 24/29; H01L 24/73; H01L 24/81; H01L 25/18; H01L 2224/13109; H01L 2224/13113; H01L 2224/13139; H01L 2224/13147; H01L 2224/16227; H01L 2224/32225; H01L 2224/73204; H01L 2224/81815; H01L 2224/92125; H01L 23/315; H01L 24/18; H01L 21/563; H01L 23/49816;
(Continued)

(56) References Cited

U.S. PATENT DOCUMENTS 8,125,066 B1 * 2/2012 Kang ................ H01L 23/49833
257/E23.116
8,993,380 B2 3/2015 Hou et al.
(Continued)

FOREIGN PATENT DOCUMENTS

| CN | 1080616 | 3/2002 |
| TW | 202032736 | 9/2020 |
| TW | 202203397 | 1/2022 |

OTHER PUBLICATIONS

"Office Action of Taiwan Counterpart Application", issued on Oct. 30, 2023, p. 1-p. 5.
(Continued)

*Primary Examiner* — Douglas W Owens
(74) *Attorney, Agent, or Firm* — JCIPRNET

(57) ABSTRACT

A semiconductor package includes a substrate, a semiconductor device over the substrate and a plurality of solder joint structures bonded between the semiconductor device and the substrate, wherein each of the plurality of solder joint structures includes, by weight percent, 2% to 23% of Indium (In).

20 Claims, 22 Drawing Sheets

(51) Int. Cl.
*H01L 23/498* (2006.01)
*H01L 25/18* (2023.01)

(52) U.S. Cl.
CPC .............. *H01L 24/13* (2013.01); *H01L 24/29* (2013.01); *H01L 24/73* (2013.01); *H01L 24/81* (2013.01); *H01L 25/18* (2013.01); *H01L 2224/13109* (2013.01); *H01L 2224/13113* (2013.01); *H01L 2224/13139* (2013.01); *H01L 2224/13147* (2013.01); *H01L 2224/16227* (2013.01); *H01L 2224/32225* (2013.01); *H01L 2224/73204* (2013.01); *H01L 2224/81815* (2013.01); *H01L 2224/92125* (2013.01)

(58) Field of Classification Search
CPC .......... H01L 24/05; H01L 24/11; H01L 24/32; H01L 24/83; H01L 23/481; H01L 23/3672; H01L 23/50; H01L 24/02; H01L 2224/02331; H01L 2224/02379; H01L 2224/02381
See application file for complete search history.

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2022/0324063 | A1* | 10/2022 | Choudhury .......... B23K 35/025 |
| 2023/0063304 | A1* | 3/2023 | Liu ...................... H01L 23/145 |

OTHER PUBLICATIONS

"Office Action of Taiwan Counterpart Application", issued on May 28, 2024, p. 1-p. 6.

* cited by examiner

SEMICONDUCTOR PACKAGE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor devices.

As semiconductor technologies further advance, wafer level integration and packaging has emerged as an effective alternative to further reduce the physical size of a semiconductor device. A plurality of functional dies (e.g., active circuits such as logic, memory, processor circuits and the like) of a certain type may be formed on a substrate. In wafer level packages such as reconstituted wafers, functional dies of different types are singulated from their respective substrates, placed together on a carrier substrate, and packaged together as a single functional device. Other wafer process technologies (e.g., system-on-integrated circuit (SoIC), integrated passive devices (IPD), or the like) may also be integrated with the functional dies in order to form a functional system device. Such wafer level integration and packaging processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
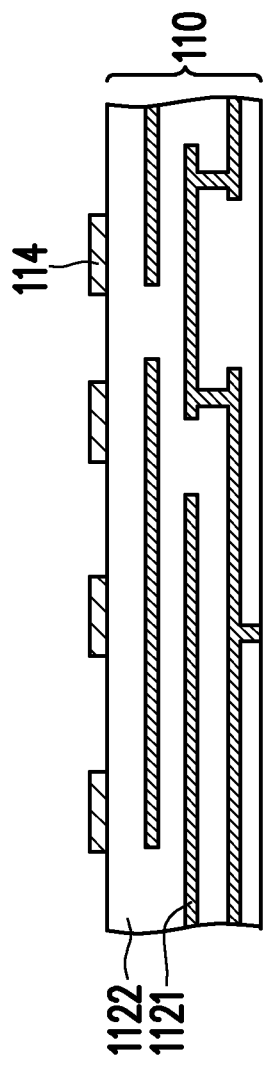
FIG. 1 to FIG. 5 illustrate partial cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. In some embodiments, interconnect devices incorporated within the package may electrically connect two or more semiconductor device. In order to ensure the package assembly area, some small wafer level package (WLP) devices are integrated into one large size WLCSP which has more I/O pads. In larger size WLCSP, due to the difference in coefficient of thermal expansion (CTE) between the silicon die and PCB, more thermal stress is generated on the solder joints. In addition, the solder bump pitch of WLCSP devices tends to decrease as well and thermal reliability is a great concern due to the smaller solder joint area. Considering all the factors listed above, a solder joint structure that requires lower process temperature in reflow process is desired in order to reduce thermal stress and warpage of the large size WLCSP. The present disclosure provides a semiconductor package and manufacturing method thereof using In-containing solder joint structure, demonstrating high stand-off controllability, good electro-migration resistance at solder joints, and high reliability in the semiconductor package. It is understood that the disclosure is not limited by the method described below. A manufacturing process of a semiconductor package is illustrated below. Additional operations can be provided before, during, and/or after the method and some of the operations described below can be replaced or eliminated, for additional embodiments of the methods.

FIG. 1 to FIG. 5 illustrate partial cross sectional views of intermediate stages in the manufacturing of a semiconductor package according to some embodiments of the present disclosure. Referring to FIG. 1, a substrate 110 is provided. In some embodiments, the substrate 110 may include bulk silicon, doped or undoped, or an active layer of a silicon-on-insulator (SOI) substrate, etc. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. In some embodiments, a plurality of semiconductor devices (e.g., functional dies) and intermediate devices may be formed in (at least partially within) the substrate 110. The functional dies may include a wide variety of active and passive devices such as capacitors, resistors, inductors and the like that may be used to generate the desired structural and functional requirements of the design for each of the functional dies. For example, active devices and passive devices may be formed using any suitable methods either within or else on the substrate 110.

In accordance with some embodiments of the disclosure, the substrate 110 may include a redistribution structure. The redistribution structure 110 may be formed with a stack of metallization layers comprising a series of conductive layers 1121 embedded in a series of dielectric layers 1122. It is noted that, for the purposes of clarity and simplicity, the individual layers of the conductive layers 1121 and the series of dielectric layers 1122 of the redistribution structure are illustrated in an abstract manner. The redistribution structure may be formed by stacking conductive layers and dielectric layers alternately. For example, a first dielectric material may be deposited, openings may be formed within the first dielectric material, and the openings may be filled with conductive material to form conductive vias and conductive lines. The process may be repeated as often as desired until an uppermost conductive layer has been formed.

In some embodiments, a plurality of (external) contact pads 114 are formed over and electrically connected to the substrate 110 to provide external connectivity to, for example, functional dies, intermediate devices, and/or through substrate vias in the substrate 110. The contact pads 114 may include aluminum, but other materials, such as aluminum, copper, silver, gold, nickel, tungsten, alloys thereof, and/or multi-layers thereof, may also be used. The contact pads 114 may be formed using a deposition process, such as sputtering, to form a layer of material (not shown) and portions of the layer of material may then be removed through a suitable process (such as photolithographic masking and etching) to form the contact pads 114. However, any other suitable process may be utilized. The contact pads 114 may be formed to have a thickness of between about 0.5 μm and about 10 μm, such as about 1.45 μm. However, any suitable thickness may be used.

In some embodiments, a portion of each of the contact pads 114 is protected by a passivation layer with the remaining portion of each of the contact pads 114 exposed. The passivation layer may be made of soft (or deformable) dielectric material(s), such as polymers, to relieve bonding stress, in accordance with some embodiments. In some embodiments, additional passivation layer(s) may be formed over redistribution structure and at the same level of, or over, the contact pads 114. In some embodiments, the additional passivation layer(s) includes silicon oxide, silicon nitride, un-doped silicate glass (USG), polyimide, or combinations thereof.

Figure 2:
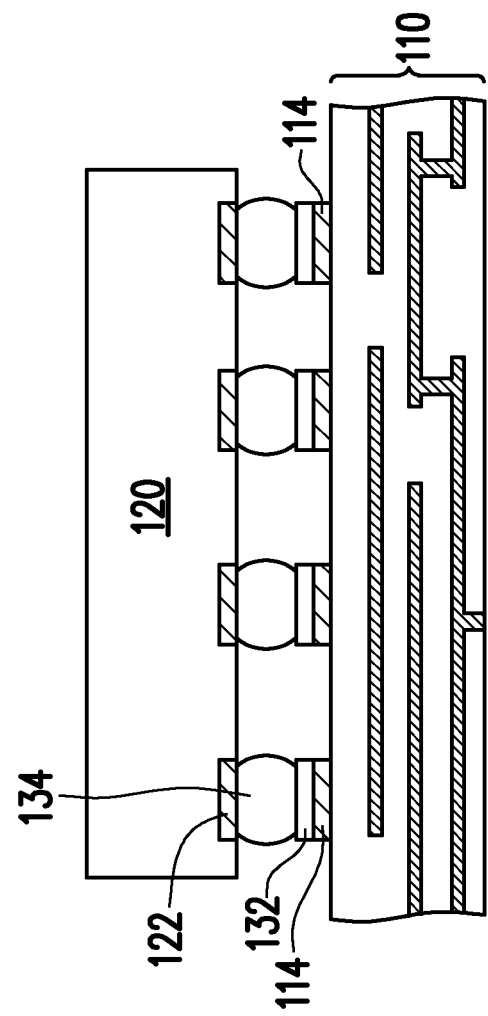

Then, referring to FIG. 2, a solder layer 132 and a solder ball 134 are provided over the substrate 110, and at least one semiconductor device (one semiconductor device 120 is illustrated, but not limited thereto) is over the substrate 110. In some embodiments, the solder layer 132 may be applied on each of the contact pads 114 through, for example, screen or stencil printing, dispensing, or the like. For example, a stencil defining a plurality of openings aligned with the contact pads 114 is provided. The stencil may be used during intermediate processing steps of the solder printing process by attachment to the substrate 110. Next in the processing, a solder paste is provided overlying the contact pads 114 to form the solder layer 132 shown in FIG. 2. In some embodiments, the solder paste may be applied over the contact pads 114 using a squeegee sweeping solder paste so as to cover the top of the substrate 110 and to force the solder paste into the openings of the stencil. In some embodiments, preparing solder pastes includes blending any of the following solder particles in a rosin-based flux medium. In some embodiments, the solder layer 132 may include solder material such as Sn, Pb, Ag, Cu, Ni, bismuth (Bi), combinations thereof, or other suitable solder material.

In some embodiments, the semiconductor device 120 mounted with the solder balls 134 on the active surfaces is provided over substrate 110. The solder balls 134 are further aligned with the solder layer 132. In some embodiments, the solder balls 134 may include solder material, gold, copper, gold coated by the solder material, or copper coated by the solder material. The solder material may include solder or solder alloy such as Sn—Ag, Sn—Ag—Cu, Sn—Bi, Sn—Cu, etc. In some embodiments, the solder material is made of solder alloy including Sn, Pb, Ag, Cu, Ni, bismuth (Bi), or combinations thereof. The use of the word "solder" herein includes both lead-based and lead-free solders, such as Pb—Sn compositions for lead-based solder; lead-free solders including tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, SAC 405, or a solder including a minor element such as Ni or Bi with about 0.5 percent in weight (wt %), as examples. The solder balls 134 may be formed from SnCu compounds as well, without the use of silver (Ag). The solder balls 134 may be formed as a grid, referred to as a "ball grid array" or "BGA". The solder ball 134 may be a conductive ball having a shape of a partial sphere in some embodiments. Alternatively, the solder ball 134 may be in other shapes. The solder ball 134 may also include non-spherical conductive connectors, for example. The solder ball 134 is attached in some embodiments using a solder ball drop process.

In accordance with some embodiments of the disclosure, at least one of the solder layer 132 and the solder ball 134 includes indium (In). That is, either one or both of the solder layer 132 and the solder ball 134 includes indium. In the present embodiment, the solder layer 132 contains indium, and the solder ball 134 is free of indium, but the disclosure is not limited thereto. For example, the solder layer 132 is a $SnIn_x$ solder paste and the solder ball 134 is Sn—Ag—Cu (SAC) solder ball. The amount of indium contained in the solder layer 132 and/or the solder ball 134 may be adjusted, so that the solder joint structure 130 formed by bonding (i.e., reflowing) the solder layer 132 and the solder ball 134 together includes, by weight percent, 2% to 23% of indium. In one embodiment, a weight ratio of the solder layer 132 to the solder ball 134 ranges from, for example, about 0.1 to about 1. Accordingly, the solder layer 132 and/or the solder ball 134 includes indium, which has a melting point lower than 160 degrees Celsius. For example, a melting temperature of $SnIn_x$ solder ranges from about 117 degrees Celsius to about 156.6 degrees Celsius, which is much lower than a melting temperature of a solder joint without indium (normally within a range of from about 220 to about 260 degrees Celsius).

Figure 3:
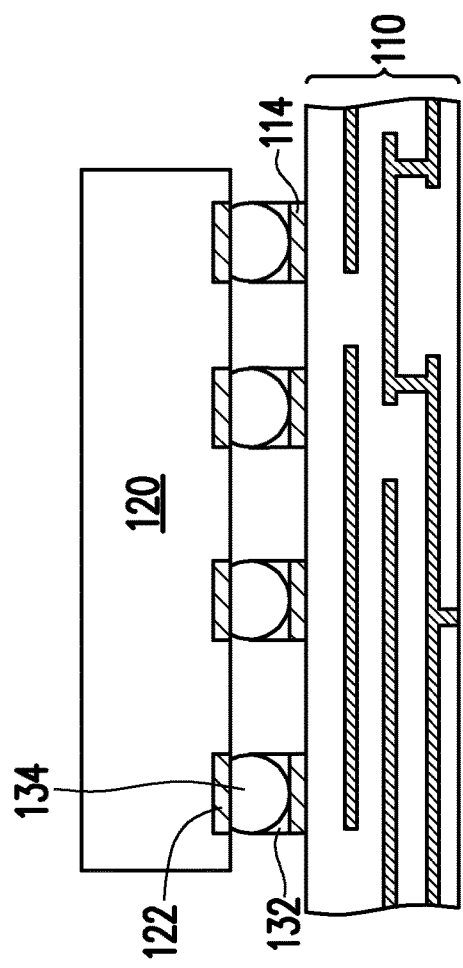
Figure 4:
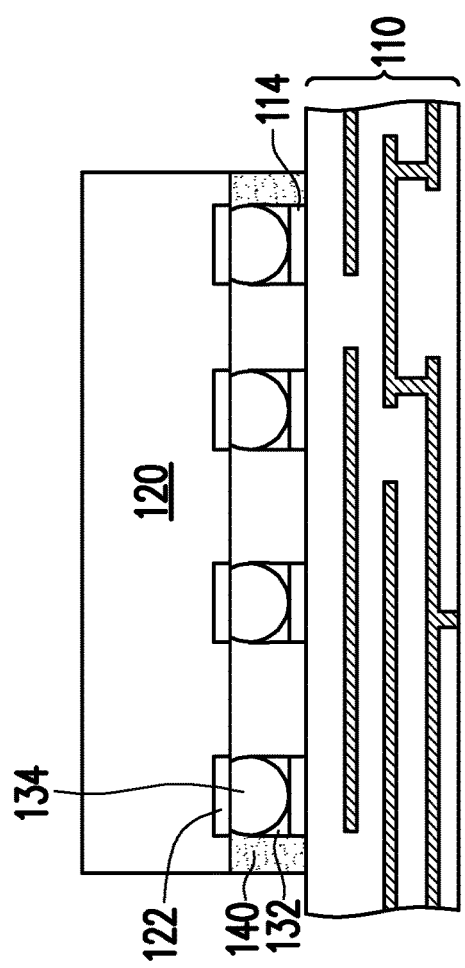
Figure 5:
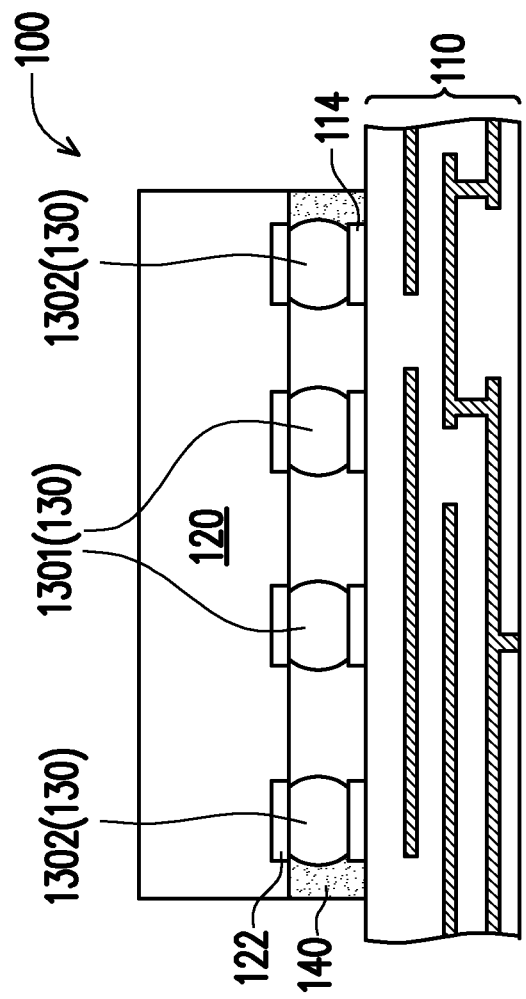

Referring to FIG. 3 to FIG. 5, accordingly, a reflow process is performed on the solder layer 132 and the solder ball 134 with a minimal amount of pressure applied thereon to form a solder joint structure 130 bonded between the substrate 110 and the semiconductor device 120, and the solder joint structure 130 includes, by weight percent, 2% to 23% of indium. In detail, as illustrated in FIG. 3, a first reflow process may firstly be performed for melting the solder layer 132 and/or solder ball 134 whichever includes indium. In the present embodiment, it is the solder layer 132 that contains indium, so the first reflow process is performed at a first process temperature above a melting temperature of the solder layer 132 for melting the solder layer 132. In some embodiments, the first process temperature may range from about 120 degrees Celsius to about 224 degrees Celsius, which is lower than a melting temperature of the solder ball 134 that is free of indium (normally within a range of from about 220 to about 250 degrees Celsius). In one embodiment, the first process temperature ranges from about 120 degrees Celsius to about 160 degrees Celsius.

Accordingly, electrical connection between the solder ball 134 and the contact pad 114 is formed by liquefying the solder layer 132. Since the solder layer 132 is transformed to a molten state, the gravity causes the solder ball 134 to subside into the solder layer 132 and physically connecting to the contact pad 114. In some embodiments, the first reflowing process at the first process temperature can be performed by an infrared lamp, a hot air pencil, heated conveyor belt, or, more commonly, by passing it through a carefully controlled oven. Note the first process temperature is controlled to be lower than a melting temperature of the solder ball 134 and higher than the melting temperature of the solder layer 132. Because the melting point of the $SnIn_x$ solder layer 132 is about 117 to 156.6 degrees Celsius and the melting point of a Sn—Ag—Cu (SAC) solder ball 134 is about 217 degrees Celsius, the first process temperature of about 120 degrees Celsius to 224 degrees Celsius causes the $SnIn_x$ solder layer 132 to liquefy but not the SAC solder ball 134.

Then, referring to FIG. 4, an underfill material 140 is provided between the semiconductor device 120 and the contact pads 114 over the substrate 110. In some embodiments, the underfill material 140 at least partially encapsulates the solder layer 132 and the solder ball 134 to maintain the standoff between the pads 122 of the semiconductor device 120 and the contact pads 114 of the substrate 110. In one embodiment, at least a lower portion of the solder ball 134 is encapsulated by the underfill material 140. In some embodiments, the underfill material 140 at least encapsulates outermost ones of the solder layer 132 and the solder ball 134 (i.e., solder joint structures 130). In an alternative embodiment, the underfill material 140 may encapsulate each of the solder layers 132 and the corresponding solder balls 134. Examples of the underfill material 140 include, but are not limited to, underfill materials such as an exposed molded underfill (eMUF), an underfill combined with an exposed molding compound, a dispensable molded underfill, molding compound, an epoxy, a resin, combinations, or the like.

Figure 25:
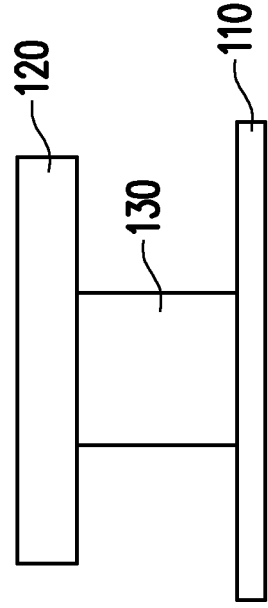
FIG. 24 to FIG. 26 illustrate partial cross sectional views of a semiconductor package according to some embodiments of the present disclosure.
Figure 24:
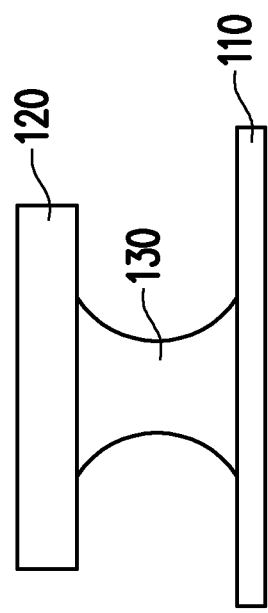
Figure 26:
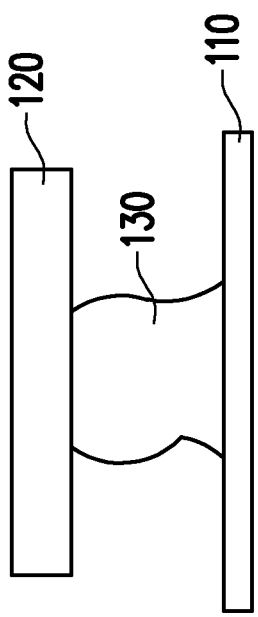

Then, referring to FIG. 5, in some embodiments, a second reflow process may be performed for melting rest of the solder layer 132 and the solder ball 134 to form a plurality of solder joint structures 130. Accordingly, the solder joint structures 130 are bonded between the semiconductor device 120 and the substrate 110. In some embodiments, forming the solder joint structures 130 includes heating the solder ball 134 and the solder layer 132 to a second process temperature higher than the first process temperature. In some embodiments, the second process temperature is controlled to be greater than the melting temperature of the solder ball 134 and the melting temperature of the solder layer 132. In some embodiments, the second process temperature may be at least about 100 degrees Celsius greater than the first process temperature. Because the melting point of a Sn—Ag—Cu (SAC) solder ball is about 217 degrees Celsius, the second process temperature of from about 220 to about 260 degrees Celsius causes both the $SnIn_x$ solder layer 132 and the SAC solder ball 134 to liquefy and form the solder joint structure 130 bonded between the semiconductor devices 120a, 120b and the substrate 110. In one embodiment, the second process temperature ranges from about 230 to about 250 degrees Celsius. At this point, a semiconductor package 100 may be substantially formed. In the present embodiment, the shapes of the solder joint structure 130 may substantially be in a ball shape, but the disclosure is not limited thereto. In other embodiments, the solder joint structure 130 may also be in hourglass shape as illustrated in FIG. 24, rectangular shape as illustrated in FIG. 25, irregular shape such as the solder joint structure 130 illustrated in FIG. 26, or other suitable shapes.

In some embodiments, the amount of indium contained in the solder layer 132 and/or the solder ball 134 is adjusted to a point that the solder joint structure 130, formed by reflowing the solder layer 132 and the solder ball 134, includes 2% to 23% of indium by weight percent. In one embodiment, a weight ratio of the solder layer 132 to the solder ball 134 ranges from, for example, about 0.1 to about 1.2. For example, a weight ratio of the solder layer 132 to the solder ball 134 ranges from, for example, about 0.4 to about 1. In some embodiments, the solder joint structure 130 includes SnX alloys having an alloy melting temperature lower than the second process temperature, i.e., about 220 to about 260 degrees Celsius. In some embodiments of the present disclosure, the solder joint structure 130 includes, apart from In, at least one element selected from Bi, Sb, Po, Ge, Pb, Ni, Al, Ga, Tl, Sn, Ag, Cu, and the arbitrary combination thereof. In accordance with some embodiments of the disclosure, based on experimental results, having 2% to 23% of indium, by weight percent, distributed in the solder joint structure 130 allows the solder layer 132 and the solder ball 134 to be reflowed under a lower process temperature (e.g., about 120 degrees Celsius to 160 degrees Celsius), so as to have less warpage in package and better thermal cycle properties. Meanwhile, during operation, the solder joint structure 130 can remain in solid state at such process temperature (e.g., about 120 degrees Celsius to 160 degrees Celsius) since the melting point of the solder joint structure 130 is increased by mixing with other solder material (e.g., SAC ball). Accordingly, having 2% to 23% of indium, by weight percent, distributed in the solder joint structure 130 contributes to better electro-migration, robust thermal cycle properties and favorable thermal endurance compared to the case where no indium is present in the solder joint structure 130.

In one embodiment, the solder joint structures 130 may include a plurality of central solder joint structures 1301 and a plurality of peripheral solder joint structures 1302 surrounding the central solder joint structures 1301, and the underfill material 140 at least encapsulates outer surfaces of the peripheral solder joint structures 1302. In the present embodiment, the central solder joint structures 1301 are free of encapsulation of the underfill material 140. That is, the underfill material 140 encapsulates the outer surfaces of the peripheral solder joint structures 1302 without encapsulating the central solder joint structures 1301. However, the disclosure is not limited thereto. In other embodiments, the underfill material 140 may encapsulate each of the solder joint structures 130, e.g., both the central solder joint structures 1301 and the peripheral solder joint structures 1302).

FIG. 6 to FIG. 12 illustrate partial cross sectional views of intermediate stages in the manufacturing of a semiconductor package according to some embodiments of the present disclosure. Embodiments will now be described with respect to specific embodiments which integrate a plurality of functional dies of different types in a single silicon wafer and integrated redistribution and integrated fan out technology in order to provide a system on silicon wafer (SoSW) device with high performance in a compact and low cost structure. However, the embodiments described herein may be applied in a wide variety of structures and methods, and all such structures and methods are fully intended to be included within the scope of the embodiments. It is noted that the semiconductor package shown in FIG. 6 to FIG. 10 contains many features same as or similar to the semiconductor package disclosed earlier with FIG. 1 to FIG. 5. For purpose of clarity and simplicity, detail description of same or similar features may be omitted, and the same or similar reference numbers denote the same or like components.

Figure 6:
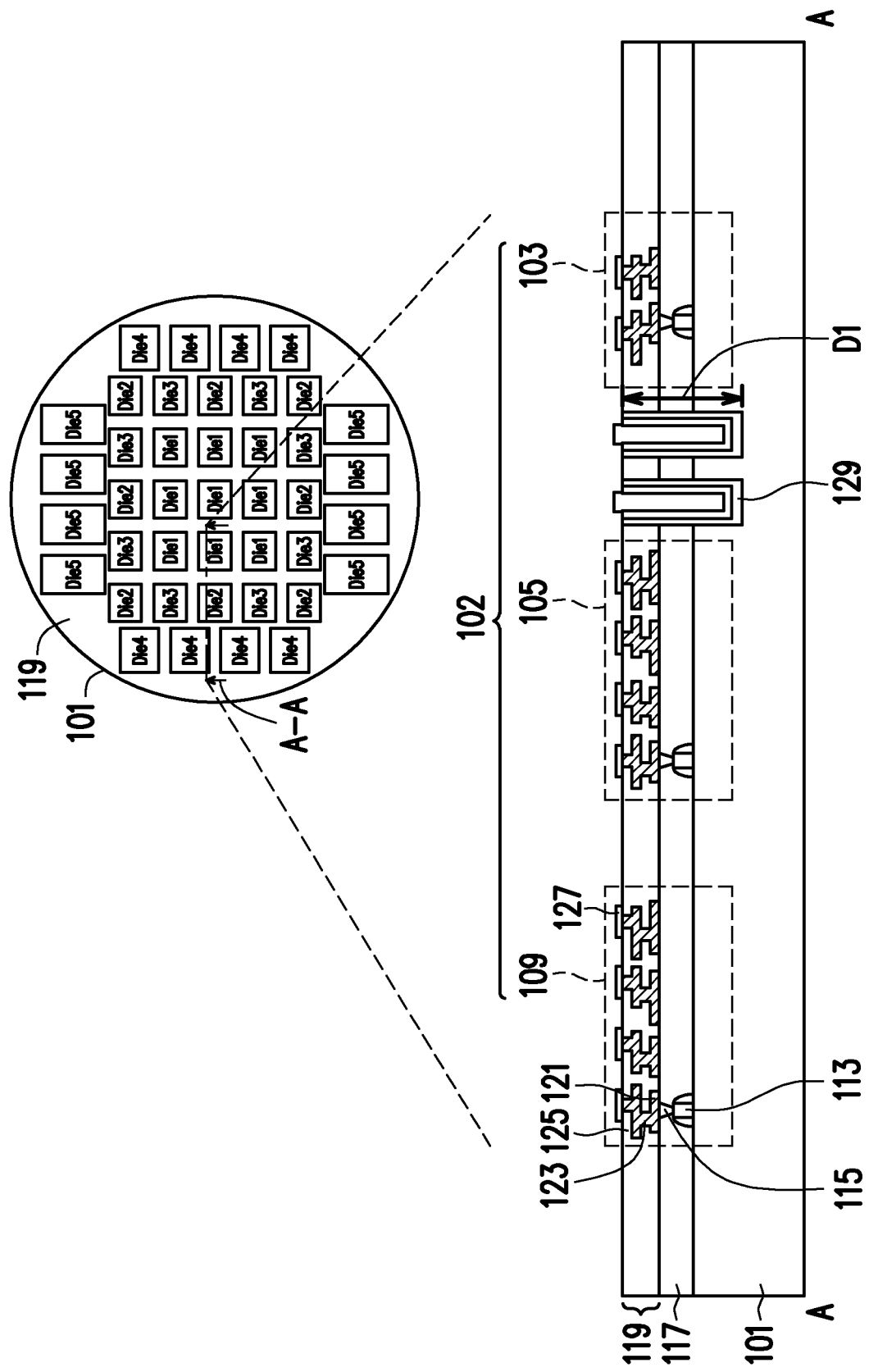
FIG. 6 to FIG. 12 illustrate partial cross sectional views of intermediate stages in the manufacturing of a semiconductor package according to some embodiments of the present disclosure.

With reference now to FIG. 6, in some embodiments, the substrate 110 is illustrated with a plurality of different types of functional dies 102 formed within and over a wafer (with FIG. 6 illustrating a cross-sectional view along a first cutline A-A). Each type of the functional dies 102 provides a distinct and different function, has a distinct and different pattern size (e.g., footprint), and/or has a unique wafer location. According to some embodiments, the locations of the functional dies 102 may be arranged according to the functions of the types of dies and/or according to relative locations and/or functions of adjacent dies. Examples of the functional dies 102 include, but are not limited to, active devices such as, digital cores (e.g., digital signal processing (DSP) core), central processing units (CPU), graphics processing units (GPU), field programmable gate array (FPGA), artificial intelligence (AI), accelerators, input/output (I/O) dies, static random access memory (SRAM), and passive devices such as, integrated passive device (IPD) (e.g., inductors (L), capacitors (C), resistors, transformers, and the like), low dropout (LDO) components, integrated voltage regulator (IVR) components, or the like).

In the present embodiment, the wafer shown in FIG. 6 includes five different types of functional dies 102. For example, first dies 103 may perform a first function (e.g., digital core), second dies 105 may perform a second function (e.g., SRAM), third dies 107 may perform a third function (e.g., FPGA), fourth dies 109 may perform a fourth function (e.g., I/O interface), and fifth dies 111 may perform a fifth function (e.g., accelerators). However, any suitable number and any suitable type of the functional dies 102 may be used.

FIG. 6 illustrates a first cutline A-A through a first portion of the wafer and a second cutline B-B through the entirety of the wafer including the first portion. In particular, the first cutline A-A is cut through three adjacent dies including one of the first dies 103, one of the second dies 105, and one of the fourth dies 109. The second cutline B-B is cut through an entire row of functional dies 102 including those dies cut through by the first cutline A-A. The second cutline B-B cuts through seven adjacent dies including three of the first dies 103, two of the second dies 105, and two of the fourth dies 109. The first cutline A-A and the second cutline B-B will be referenced with the following figures to illustrate cross-sectional views of the semiconductor wafer, according to some embodiments. However, any suitable number and any suitable type of the functional dies may be used.

Additionally, the wafer in FIG. 6 illustrates a particular embodiment with a particular combination of dies, and these dies are used as examples for discussion purposes only with regard to different sizes of different functional dies and formations of different interconnects between the different dies with regard to functions and/or relative locations to one another. It is to be understood that any of the functional dies 102 may be arranged in any suitable locations, and any suitable interconnects may be formed between any suitable combinations of the functional dies 102, as will be clear with the following discussion and figures.

As illustrated, the wafer includes a semiconductor substrate 101, one of the first dies 103, one of the second dies 105, one of the fourth dies 109, and intermediate devices 129. The semiconductor substrate 101 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The functional dies 102 includes a wide variety of active and passive devices 113 such as capacitors, resistors, inductors and the like that may be used to generate the desired structural and functional requirements of the design for each of the functional dies 102. For example, active devices and passive devices may be formed using any suitable methods either within or else on the semiconductor substrate 101.

In some embodiments the devices 113 may be active devices (e.g., transistors, diodes, etc.), capacitors, resistors, etc. In an embodiment, the devices 113 may be formed at a front surface of the semiconductor substrate 101 within each of the patterns of the functional dies 102. Initially, circuit patterns for each type of the functional dies 102 may be patterned into and/or over the semiconductor substrate 101 using distinct circuit mask sets for each type of die, and for each separate manufacturing process (e.g., etching, implantations, plating, etc.) for the functional dies 102. Each type of functional dies 102 and the corresponding mask sets for each type may be a different size from the other functional dies 102 and their corresponding mask sets. However different types of functional dies 102 and their corresponding mask sets may be the same size. Each of the functional dies 102 may be patterned in any location on the wafer using the corresponding mask set.

Additionally, scribe regions may be formed in between the different functional dies 102. For example, a portion of the semiconductor substrate 101 is left without active devices (although other devices such as test devices or the like may be formed in the scribe regions) by simply not imaging patterns into the region between the different functional dies 102. As such, the scribe regions act as a way of separating the different functional dies 102 from each other.

Once the active devices and/or the passive devices have been formed, an inter-layer dielectric (ILD) 117 is formed over the front surface of the semiconductor substrate 101. The ILD 117 surrounds and may cover the devices 113. The ILD 117 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

In some embodiments, conductive plugs 115 extend through the ILD 117 to electrically and physically couple the devices 113. For example, when the devices 113 are transistors, the conductive plugs 115 may couple the gates and source/drain regions of the transistors. The conductive plugs 115 may be formed of tungsten, cobalt, nickel, copper, silver, gold, aluminum, the like, or combinations thereof. An interconnect structure 119 is formed over the ILD 117 and conductive plugs 115. The interconnect structure 119 interconnects the devices 113 to form a functional device (e.g., an integrated circuit). The interconnect structure 119 may be formed, for example, by forming metallization patterns in dielectric layers on the ILD 117. The metallization patterns include metal lines 121 and vias 123 formed in one or more low-k dielectric layers 125. The metallization patterns of the interconnect structure 119 are electrically coupled to the devices 113 by the conductive plugs 115. The functional dies 102 further include pads 127, such as aluminum pads, to which external connections are made. The pads 127 are on the active side of the functional dies 102, such as in and/or on the interconnect structure 119.

In some embodiments, the wafer may further include one or more intermediate devices 129 which may be formed in and/or over the semiconductor substrate 101 between adjacent dies of the functional dies 102. The intermediate devices 129 may be any suitable active device (e.g., diodes, transistors, operational amplifiers, rectifiers, combinations, or the like) and/or passive device (e.g., capacitors, inductors, resistors, combinations or the like). For example, a deep trench capacitor may be formed as one of the intermediate devices 129 within the semiconductor substrate 101 between the first die 103 and the second die 105. However, any suitable active devices and/or passive devices may be utilized as the one or more intermediate devices 129.

Figure 7:
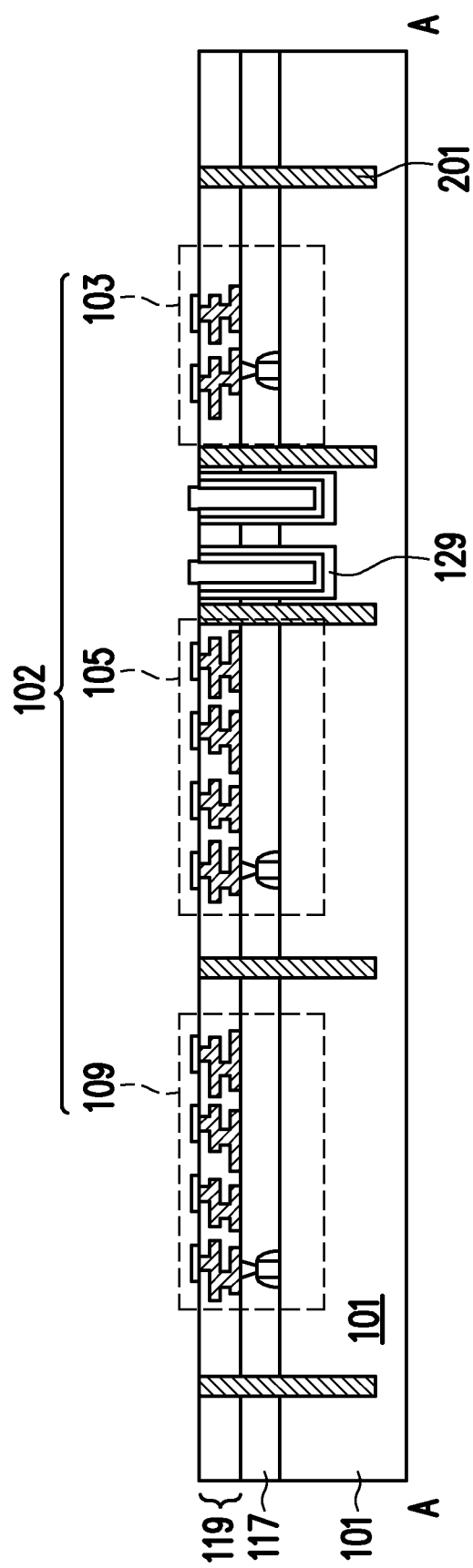

Turning to FIG. 7, this figure illustrates the formation of through substrate vias (TSVs) 201 in the wafer according to an embodiment. The through substrate vias 201 may be formed by initially forming openings through the interconnect structure 119, the ILD 117 and into the semiconductor substrate 101. According to some embodiments, the openings may be formed using a laser drilling method, by which a laser is directed towards those portions of the 119 which are desired to be removed.

Once the openings for the through substrate vias 201 have been formed, the openings may be filled with, e.g., a barrier layer (not shown) and a conductive material. The barrier layer may include a conductive material such as titanium nitride, although other materials, such as tantalum nitride, titanium, a dielectric, or the like may be utilized. The barrier layer may be formed using a chemical vapor deposition (CVD) process, such as plasma enhanced chemical vapor deposition (PECVD). However, other processes, such as sputtering or metal organic chemical vapor deposition (MOCVD), may be used. The barrier layer may be formed so as to contour to the underlying shape of the opening for the through substrate vias 201.

In some embodiments, the conductive material may include copper, although other suitable materials such as aluminum, alloys, doped polysilicon, combinations thereof, and the like, may be utilized. The conductive material may be formed by depositing a seed layer and then electroplating copper onto the seed layer, filling and overfilling the openings for the through substrate vias 201. Once the openings for the through substrate vias 201 have been filled, excess material of the barrier layer and excess conductive material outside of the openings may be removed through a grinding process such as chemical mechanical polishing (CMP), although any suitable removal process may be used. The through substrate vias 201 may be formed in a TSV first process or in a TSV middle process.

Additionally, while the above description of the forming of the openings for the through substrate vias 201 is described with respect to forming the openings of the through substrate vias 201 after formation of the interconnect structure 119, this is intended to be illustrative and is not intended to be limiting. Rather, the openings for the through substrate vias 201 may be formed at any point during the manufacturing process. For example, the openings for the through substrate vias 201 may be formed in the semiconductor substrate 101 prior to formation of the interconnect structure 119, or after formation of any suitable layer over the semiconductor substrate 101. Any suitable timing for forming the openings and the conductive material may be utilized and all such timings are fully intended to be included within the scope of the embodiments.

Figure 8:
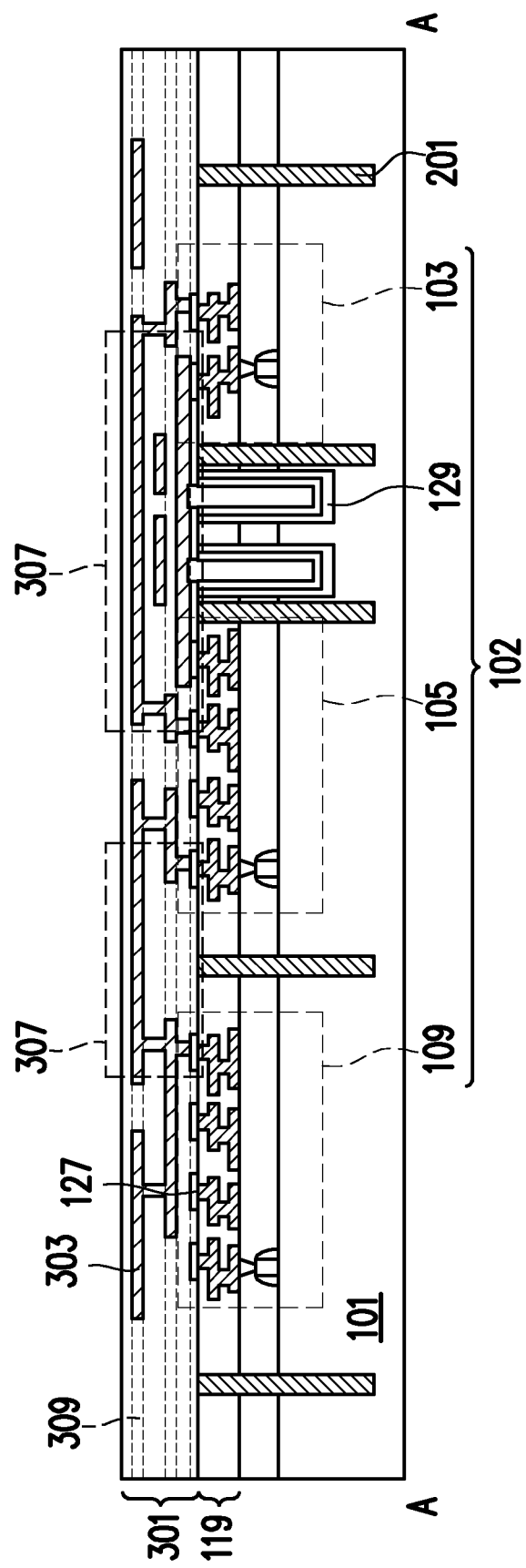

With now reference to FIG. 8, once the through substrate vias 201 have been formed, the first metallization structure 301 is formed over the interconnect structure 119 in order to interconnect the functional dies 102 without singulating the functional dies 102 from each other. The first metallization structure 301 provides local interconnects 307 between the functional dies 102, the intermediate devices 129, and/or the through substrate vias 201 and provides the functional dies 102 and/or the through substrate vias 201 electrical connectivity to overlying structures.

In an embodiment, the first metallization structure 301 includes a series of first conductive layers 303 embedded within a first series of dielectric layers 309. In an embodiment, a first layer of the series of dielectric layers 309 is formed over the interconnect structure 119 including the exposed surfaces of the functional dies 102 and the intermediate devices 129. The first layer in the series of dielectric layers 309 may be formed using one or more materials such as Phospho-Silicate Glass (PSG), Boro-Silicate Glass (BSG), Boron-Doped Phospho-Silicate Glass (BPSG), undoped Silicate Glass (USG), or the like. The first layer of the series of dielectric layers 309 may be placed using, e.g., a spin-coating process, although any suitable method such as chemical vapor deposition (CVD), physical vapor deposition (PVD), atomic layer deposition (ALD), combinations of these, or the like may be used. The conductive layers 303 may include conductive vias and conductive trenches. In an embodiment the conductive material may be a material such as copper formed through a deposition process such as an electroplating process, although any suitable deposition process and material may be used to fill and/or overfill the openings within the first layer of the series of dielectric layers 309.

Once the first layer of the series of dielectric layers 309 has been formed, further layers of the series of conductive layers 303 and further layers of the series of dielectric layers 309 may be formed by repeating steps similar to those used to form the first layer of the series of dielectric layers 309 and the first layer of the series of first conductive layers 303, respectively. These steps may be repeated as desired until the first metallization structure 301 has a desired number of metallization layers, such as two metallization layers or three metallization layers, although any suitable number of individual metallization layers may be utilized. Furthermore, the first metallization structure 301 may also be referred to herein as a front-side metallization layer of the wafer.

According to some embodiments, the first metallization structure 301 may include local interconnects 307 which electrically and functionally connect adjacent ones of the functional dies 102 and the integrated devices 129. For example, one local interconnect 307 may be used to interconnect the second die 105 to adjacent devices, such as the die 109 or 103. Additionally, in some embodiments, the local interconnects 307 may be formed to connect the intermediate devices 129 to one another and/or connect a pad 127 of a functional die 102 to one or more of the intermediate devices 129. As such, the local interconnects 307 may electrically couple two or more of the functional dies 102 to one another and may electrically couple one or more of the intermediate devices 129 to one or more of the functional dies 102.

Figure 9:
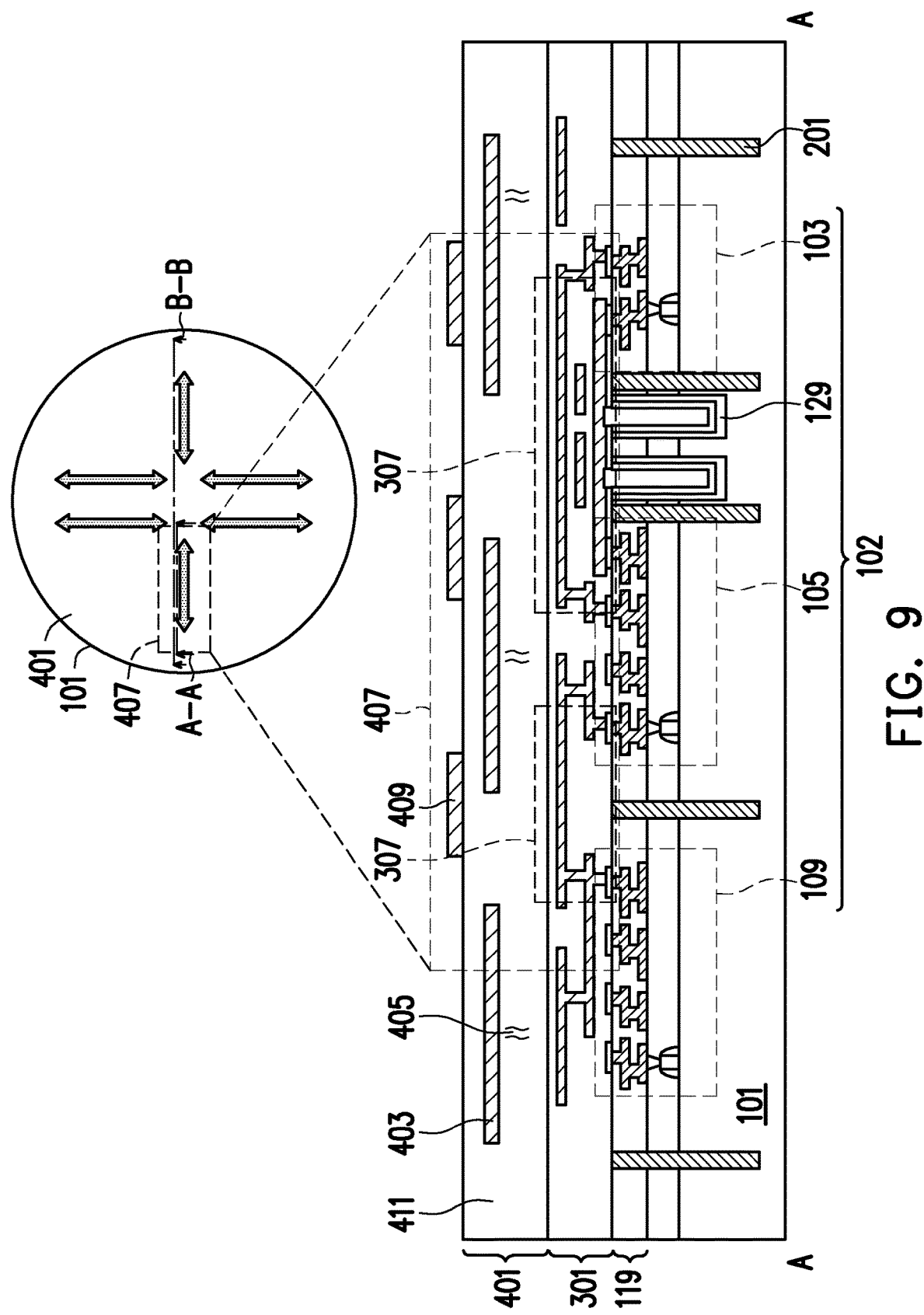

Referring to FIG. 9, a second metallization structure 401 is then formed over the first metallization structure 301. The second metallization structure 401 may be formed with a stack of metallization layers comprising a series of second conductive layers 403 embedded in a second series of dielectric layers 411. The individual layers of the second conductive layers 403 and the second series of dielectric layers 411 of the second metallization structure 401 are not separately illustrated but are instead represented by the symbol 405. The second metallization structure 401 may be formed using similar processes and similar materials as the first metallization structure 301 described above with respect to FIG. 8.

In some embodiments, the second metallization structure 401 in conjunction with portions of the first metallization structure 301 provides semi-global interconnects 407 and/or global interconnects (not shown) between the functional dies 102, the intermediate devices 129, and/or the through substrate vias 201 and provides the functional dies 102 and/or through substrate vias 201 electrical connectivity to overlying structures. According to some embodiments, the semi-global interconnect 407 electrically couples the die 103 to the die 109, the die 103 being separated from the die 109 by the die 105 in the example illustrated in FIG. 9. However, according to other embodiments, a global interconnect (not shown) may connect two of the functional dies 102 and/or through substrate vias 201 on opposite sides of the wafer.

According to some embodiments, one or more intermediate devices 129 may be integrated into the second metallization structure 401. Conductive features in the series of second conductive layers 403 may electrically couple one or more of the intermediate devices 129 to one another. As such, the semi-global interconnect 407 and/or global interconnect may be formed to electrically couple one or more of the intermediate devices 129 between two of the functional dies 102.

Once the second metallization structure 401 has been formed, external contact pads 409 may be formed over and electrically connected to the second metallization structure 401 to provide external connectivity to the functional dies 102, the intermediate devices 129, and/or the through substrate vias 201. The external contact pads 409 may include aluminum, but other materials, such as copper, may also be used. The external contact pads 409 may be formed using a deposition process, such as sputtering, to form a layer of material (not shown) and portions of the layer of material may then be removed through a suitable process (such as photolithographic masking and etching) to form the external contact pads 409. However, any other suitable process may be utilized.

Figure 10:
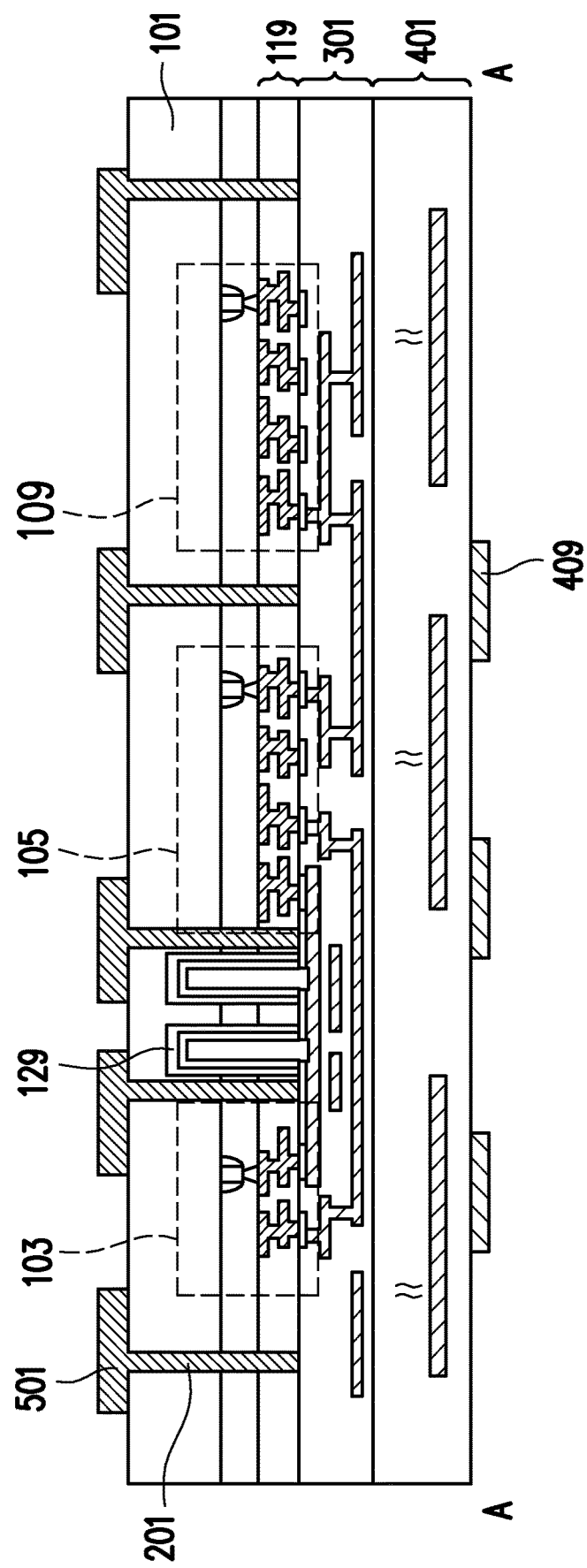

With now referring to FIG. 10, in some embodiments, a thinning process that is performed on the backside of the semiconductor substrate 101 and a formation of a first backside redistribution line (RDL) 501 over the through substrate vias 201 as intermediate steps in forming the system on silicon wafer (SoSW) device. In detail, once the external contact pads 409 have been formed, the wafer structure shown in FIG. 9 may be flipped over and placed, for example, on a carrier substrate (not shown) in preparation of further processing. The thinning of the semiconductor substrate 101 may be performed (e.g., using a mechanical grinding or a CMP process) until the conductive material of the through substrate vias 201 has been exposed.

Once the through substrate vias 201 have been exposed, the first backside redistribution line (RDL) 501 are formed, where the first backside RDL 501 may be formed of copper, aluminum, nickel, or the like. The first backside RDL 501 is electrically coupled to the through substrate vias 201 and conductive features of the first metallization structure 301 and/or the second metallization structure 401. As such, the first backside RDL 501 provides an arrangement to connect signal lines between the functional dies 102.

In some embodiments, an additional backside redistribution layers (e.g., third conductive layers 403 shown in FIG. 9) may be formed over the first backside RDL 501 in order to form a backside redistribution structure 601. The optional backside redistribution structure 601 may be formed to interconnect two or more of the through substrate vias 201 to provide backside interconnects 609. Furthermore, the optional backside redistribution structure 601 may be, for example, a wafer scale integrated fan-out (InFO) redistribution layer.

According to some embodiments, the through substrate vias 201 may be connected to the functional dies 102 via the local interconnects 307 and/or the semi-global interconnects 407. In some embodiments, the through substrate vias 201 may be connected to the external contact pads 409 via the first metallization structure 301 and the second metallization structure 401. As such, the backside redistribution structure 601 may be formed to electrically couple two or more of the first backside RDL 501 to one another and, in combination with the through substrate vias 201, the local interconnects 307, the semi-global interconnects 407, and/or global interconnects, to electrically couple one or more of the functional dies 102, the intermediate devices 129, and/or the external contact pads 409 to one another as desired.

Figure 11:
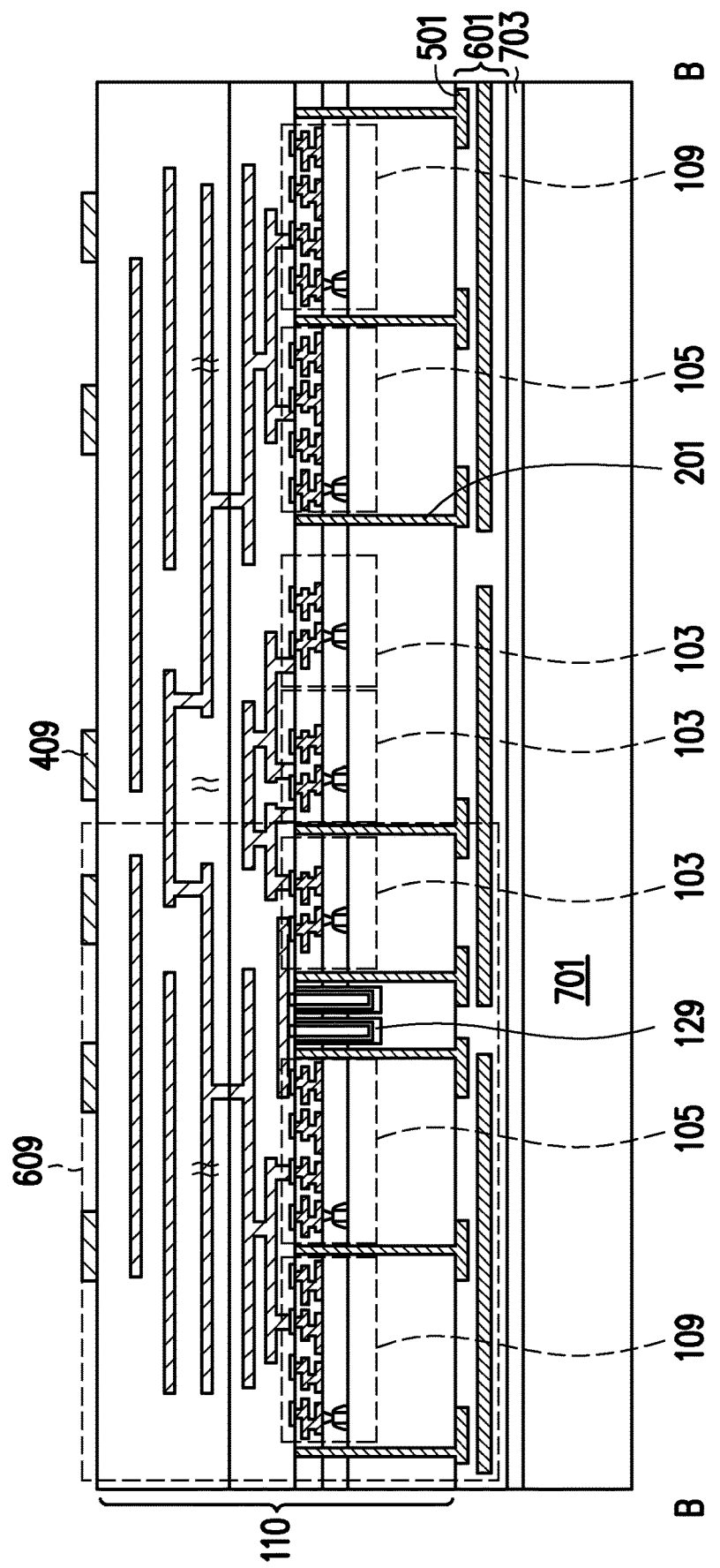

FIG. 11 illustrates a cross-sectional view of the system on silicon wafer device 110 and the optional backside redistribution structure 601 through the second cutline B-B according to some embodiments. Referring to FIG. 11, the system on silicon wafer device 110 is disposed over and thermally coupled to a thermal module 701, in accordance with some embodiments. The thermal module 701 may be a heat sink, a heat spreader, a cold plate, or the like. However, any suitable heat transfer device may be used. According to some embodiments, the thermal module 701 may be attached to the optional backside redistribution structure 601 using e.g., a thermal interface material (TIM) 703 such as, e.g., a thermal adhesive. According to some embodiments, the thermal interface material (TIM) 703 may be formed of a metal, a metal paste, or a film comprising a thermally conductive material. However, any suitable thermal interface material may be used.

The thermal interface material (TIM) 703 may be dispensed or placed on the back side of the optional backside redistribution structure 601 and the thermal module 701 may be arranged over the optional backside redistribution structure 601 (e.g., via pick and place tool), according to some embodiments. As such, the thermal module 701 is physically and thermally coupled to the optional backside redistribution structure 601. Once the thermal module 701 has been attached, the combined structures may be flipped over for further processing, as illustrated in FIG. 11.

Figure 12:
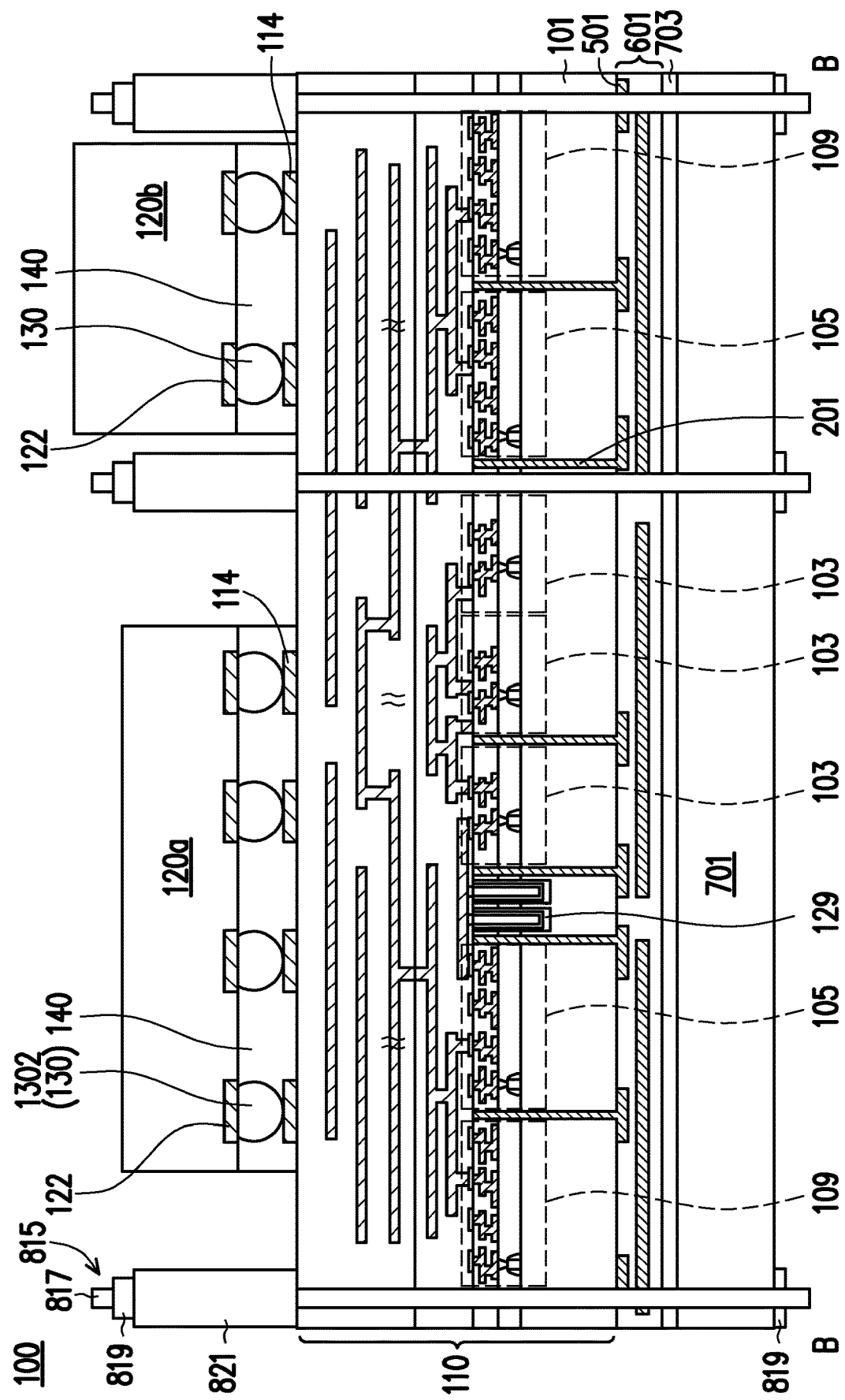

Continuing to FIG. 12, this figure illustrates the formation of a system on silicon wafer (SoSW) package 100, in accordance with some embodiments. In detail, FIG. 12 illustrates the bonding of a power module 120a, a connector 120b, and a plurality of screw assemblies to the combined structures of FIG. 11. In accordance with some embodiments of the disclosure, the bonding method illustrated in FIG. 1 to FIG. 5 can be applied to the bonding of the power module 120a and the connector 120b to the system on silicon wafer device 110. For example, the system on silicon wafer device 110 may be analogous as the substrate 110 shown in FIG. 1 to FIG. 5, while the power module 120a and the connector 120b may be analogous as the semiconductor device 120a, 120b shown in FIG. 1 to FIG. 5.

Accordingly, the power module 120a and the connector 120b are attached to the external contact pads 114 at the front side of the system on silicon wafer device 110. The power module 120a and the connector 120b are interfaces for external connection to the system on silicon wafer (SoSW) package 100. The power module 120a and the connector 120b include pads 122, such as aluminum pads, to which external connections are made. The power module 120a and the connector 120b are mounted to the external contact pads 114 using the solder joint structures 130. For purpose of clarity and simplicity, detail description of same or similar features for the power module 120a and the connector 120b to be bonded to the system on silicon wafer device 110 through the solder joint structures 130 is omitted herein. With such bonding arrangement, the amount of indium contained in the solder layer and/or the solder ball is adjusted to a point that the solder joint structure 130 includes 2% to 23% of indium by weight percent. In accordance with some embodiments of the disclosure, having 2% to 23% of indium, by weight percent, distributed in the solder joint structure 130 allows the solder joint structure 130 to be reflowed under a lower reflow temperature, so as to have better thermal cycle properties and less warpage in a large scale package such as system on silicon wafer package 100. Meanwhile, during operation, the solder joint structure 130 can remain in solid state at such reflow temperature since the melting point of the solder joint structure 130 is increased by mixing indium with other solder material (e.g., SAC ball). Accordingly, having 2% to 23% of indium, by weight percent, distributed in the solder joint structure 130 contributes to better electro-migration, robust thermal cycle properties and favorable thermal endurance compared to the case where no indium is present in the solder joint structure 130.

In accordance with some embodiments of the disclosure, the power module 120a provides an electrical and physical interface for modules (not shown) that may be installed subsequent to manufacture of the system on silicon wafer package 100. For example, a user of the system on silicon wafer package 100 may install the modules in the system on silicon wafer package 100 to form completed functional systems with the system on silicon wafer package 100. The type of modules selected for installation depends on the type of functional systems desired. Examples of modules that may be installed in the system on silicon wafer (SoSW) package 100 include memory modules, voltage regulator modules, power supply modules, integrated passive device (IPD) modules, and the like.

In accordance with some embodiments of the disclosure, the connector 120b provides an electrical and physical interface for the system on silicon wafer package 100 to external systems. For example, when the system on silicon wafer package 100 is installed as part of a larger external system, such as a data center, the connector 120b may be used to couple the system on silicon wafer package 100 to the external system. Examples of the connector 120b include, but are not limited to, receptors for high-speed serial digital interface (SDI) cables, ribbon cables, flexible printed circuits, or the like.

The power module 120a and the connector 120b may be attached to the system on silicon wafer device 110 in a variety of layouts. The layout shown in FIG. 12 is one example. According to some embodiments, each of a plurality of the power modules 120a is mounted directly overlying and electrically coupled to the functional dies 102 corresponding to a computing site. In some embodiments, each of a plurality of the connectors 120b is disposed around the perimeter of the system on silicon wafer package 100, thus increasing the area available for the plurality of the power modules 120a. According to some embodiments, the connectors 120b are laterally offset from the functional dies 102 serving as e.g., I/O interface dies. In other embodiments, the connectors 120b directly overly the I/O interface dies.

In accordance with some embodiments of the disclosure, the screw assemblies 815 may be attached by initially forming bolt holes through the system on silicon wafer device 110 and the optional backside redistribution structure 601 (if provided). The bolt holes may be formed by a drilling process such as laser drilling, mechanical drilling, or the like. In some embodiments, the drilling process is continued through the thermal interface material (TIM) 703 and/or the thermal module 701. In other embodiments, the bolt holes are formed in the thermal module 701 prior to attachment and the thermal interface material (TIM) 703 is dispensed avoiding the bolt holes.

Once the bolt holes have been formed, the screw assemblies 815 may be used to further fasten the thermal module 701 to the system on silicon wafer device 110. The screw assemblies 815 include bolts 817, fasteners 819, and mechanical braces 821, according to some embodiments. The bolts 817 are threaded through the bolt holes of the system on silicon wafer device 110, through the bolt holes of the optional backside redistribution structure 601 (if provided), through corresponding bolt holes in the thermal module 701, and through corresponding bolt holes in the mechanical braces 821. The fasteners 819 are threaded onto the bolts 817 and tightened to clamp the system on silicon wafer device 110 between the thermal module 701 and mechanical braces 821. The fasteners 819 may be, e.g., nuts that thread to the bolts 817. The fasteners 819 attach to the bolts 202 at both sides of the resulting system on silicon wafer (SoSW) package 100 (e.g., at the side having the thermal module 701 (sometimes referred to as the back side) and at the side having the mechanical braces 821 (sometimes referred to as the front side)). At this point, the system on silicon wafer (SoSW) package 100 may be substantially formed.

Figure 21:
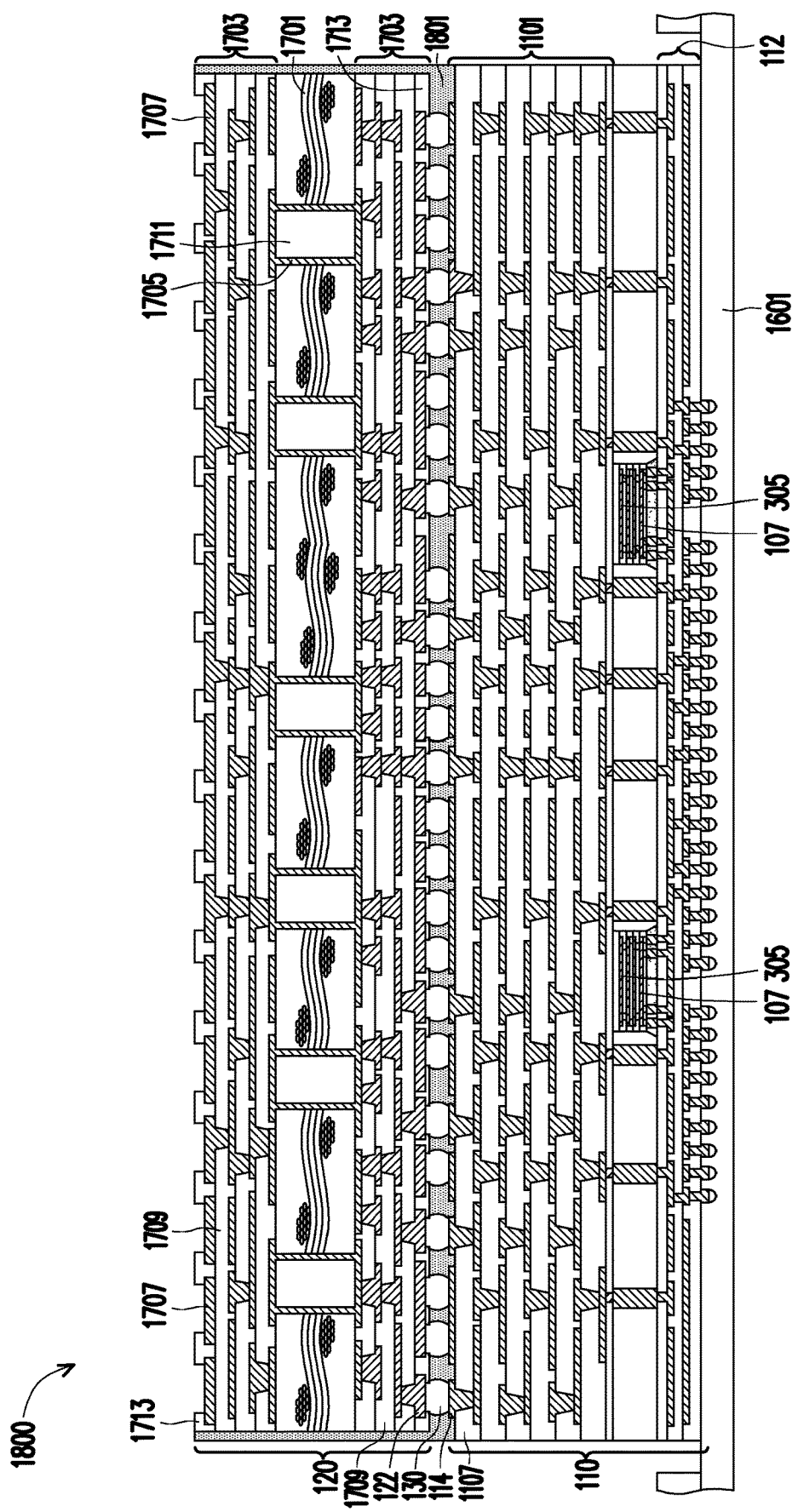
Figure 22:
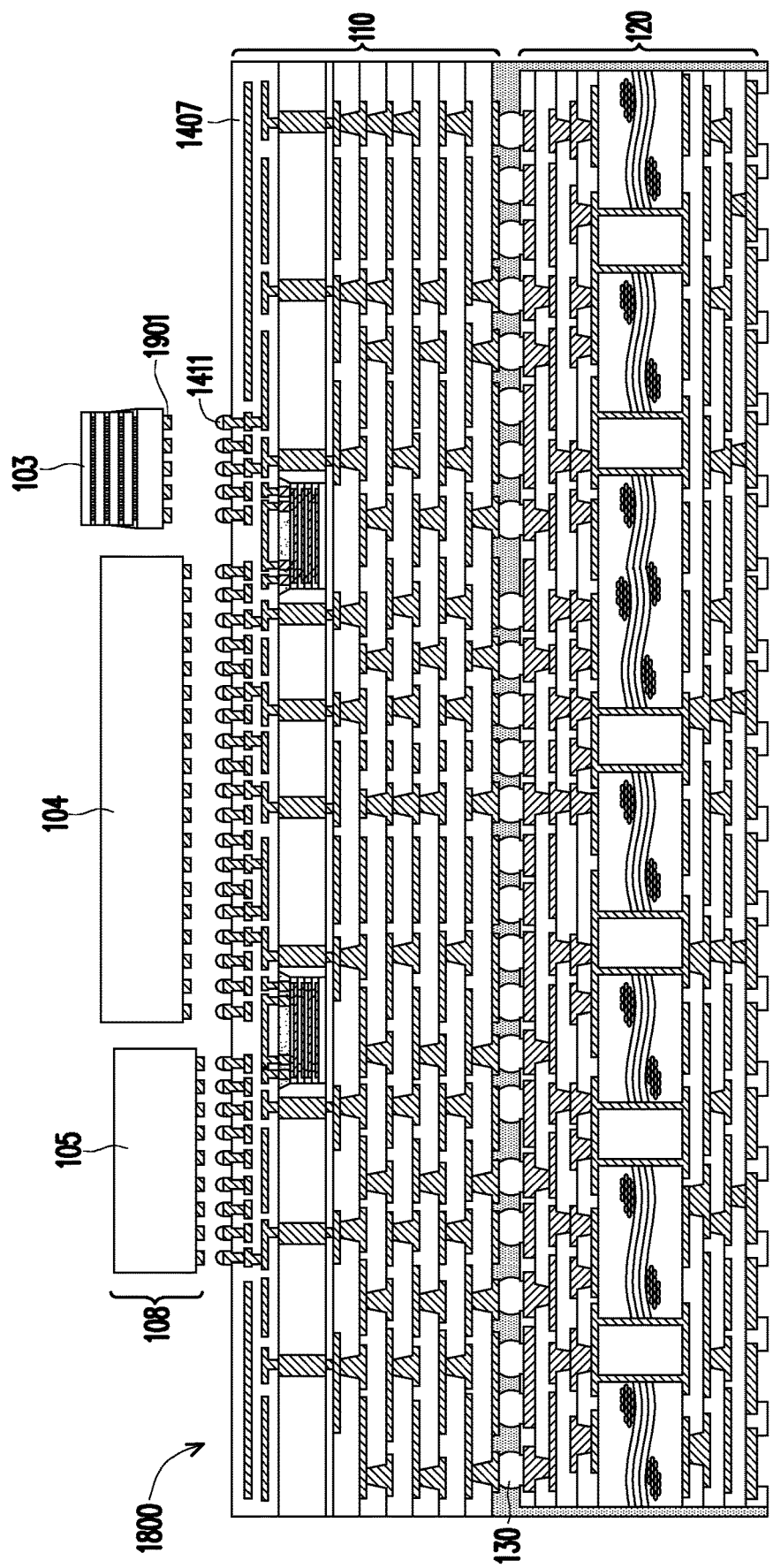
Figure 23:
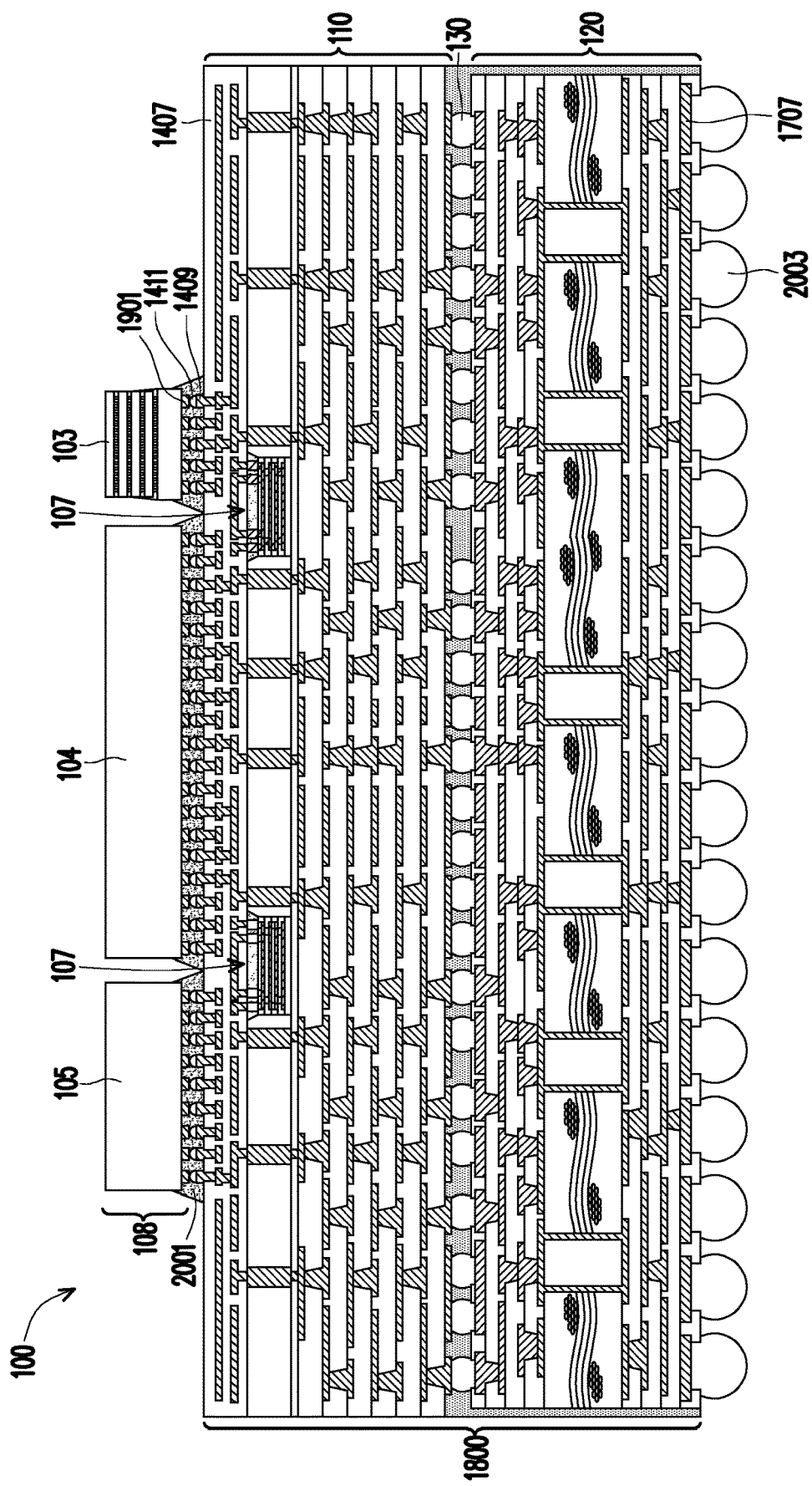

FIG. 13 to FIG. 23 illustrate partial cross sectional views of intermediate stages in the manufacturing of a semiconductor package according to some embodiments of the present disclosure. Embodiments will now be described with respect to specific embodiments of a semiconductor package 100 (e.g., a system on integrated substrate (SoIS)), in accordance with some embodiments. It is noted that the semiconductor package shown in FIG. 13 to FIG. 23 contains many features same as or similar to the semiconductor package disclosed earlier with FIG. 1 to FIG. 5. For purpose of clarity and simplicity, detail description of same or similar features may be omitted, and the same or similar reference numbers denote the same or like components. In some embodiments, the semiconductor package 100 (as illustrated in FIG. 23) includes at least one semiconductor device 120 bonded on top of an integrated substrate structure 110 in a package-on-package (PoP) arrangement (e.g., system on integrated substrate (SoIS)). The semiconductor device 120 may include devices such as an interconnect structure 120, system dies 104 (e.g., system-on-chip (SoC)), memory dies 103 (e.g., high-bandwidth memory (HBM)), and input/ output dies 105 (e.g., I/O chips) (illustrated below with respect to FIG. 23). The package-on-package (PoP) arrangement of the semiconductor package 100 provides a high level of system integration and component density. The integrated substrate structure 110 includes one or more of the local interconnects electrically connect the system dies 104, the memory dies 103, and the input/output dies 105 to one another.

Figure 13:
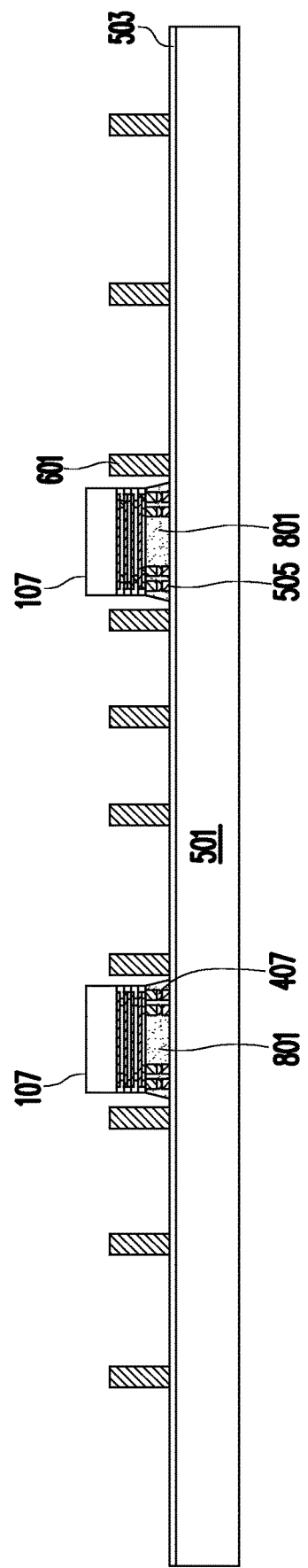
FIG. 13 to FIG. 23 illustrate partial cross sectional views of intermediate stages in the manufacturing of a semiconductor package according to some embodiments of the present disclosure.

With now reference to FIG. 13, according to some embodiments, a carrier substrate 501 having a first release film 503 coating the top surface of the carrier substrate 501 is provided. In some embodiments, the carrier substrate 501 is formed of a transparent material and may be a glass carrier, a ceramic carrier, an organic carrier, or the like. The release film 503 may be formed of a Light-To-Heat-Conversion (LTHC) coating material applied to the carrier substrate 501 in a coating process. Once applied, the LTHC coating material is capable of being decomposed under the heat of light/radiation (such as laser), and hence can release the carrier substrate 501 from the structure formed thereon.

In accordance with some embodiments of the disclosure, a plurality of pads (e.g., micro-bump pads) 505 are formed over the first release film 503. According to some embodiments, the pads 505 may include a seed layer, micro-bump pad plating, copper plating, solder plating, combinations, or the like. The pads 505 may be formed of copper, aluminum, nickel, palladium, alloys thereof, combinations, or the like. The pads 505 may be referred to herein as conductive pads, plated pads, bump pads, or pads. In some embodiments, a plurality of through molding vias (TMVs) 601 are formed over the first release film 503, in accordance with some embodiments. The through molding vias 601 may be formed by initially forming a seed layer. Once the seed layer has been formed, a plating mask (e.g., photo resist) (not shown) is deposited over the seed layer and, thus, over the release film 503 and the pads 505. Once the plating mask has been formed, it may be patterned to expose those portions of the release film 503 that are located where the through molding vias 601 will subsequently be formed. In embodiments where the plating mask is a photo resist, the patterning of the second plating mask may be done by exposing the photo resist in desired locations of the through molding vias 601 and developing the photo resist to either remove the exposed portions or the un-exposed portions of the photo resist. However, the plating mask may be patterned using any suitable patterning process.

Once the plating mask has been patterned, a conductive material may be formed on the release film 503. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the through molding vias 601. Once the conductive material has been formed, the plating mask may be removed through a suitable removal process such as an ashing process or a chemical stripping process, such as using oxygen plasma or the like and the underlying portions of the second seed layer are exposed. Once the plating mask has been removed, the exposed portions of the seed layer are etched away.

In accordance with some embodiments of the disclosure, a plurality of local interconnects 107 are placed and attached to the pads 505. However, any suitable number of the pads 505 may be formed to the release film 503 and any suitable number of the local interconnects 107 may be attached. Furthermore, more than one type of the local interconnects 107 may be attached. For example, one or more of the local interconnects 107 that are attached may have local redistribution traces 305. As another example, one or more of the local interconnects 107 that are attached may include one or more integrated devices that are different from the integrated devices contained in the other attached ones of the local interconnect 107.

In some embodiments, the local interconnects 107 may be placed on the carrier substrate 501, for example, using e.g., a pick-and-place process. In some embodiments, once the external component contacts 407 is in physical contact with the pads 505, a reflow process may be performed to bond the solder material of the external component contacts 407 to the pads 505 and thus attach the local interconnects 107 to the carrier substrate 501. In the present embodiment, the external component contacts 407 may include solder joint structures, and the solder bonding technique described in FIG. 1 to FIG. 5 may be applied herein for bonding the local interconnects 107 to the pads 505 on the carrier substrate 501 through solder joint structures. However, while the above described process describes using the solder bonding technique in order to connect the local interconnects 107, this is intended to be illustrative and is not intended to be limiting. Rather, any suitable method of bonding, such as metal-to-metal bonding, hybrid bonding, fusion bonding, combinations of these, or the like, may be utilized to connect the local interconnects 107. All such methods are fully intended to be included within the scope of the embodiments.

Once the local interconnects 107 have been attached, an underfill 801 can be deposited in the gap between each of the local interconnects 107 and the release film 503. The underfill 801 may be a material such as an underfill material, a molding underfill (MUF), a molding compound, an epoxy, a resin, or the like. The underfill 801 protects the external component contacts 407 and provides structural support for the local interconnects 107. In some embodiments, the underfill 801 may be cured after deposition.

Figure 14:
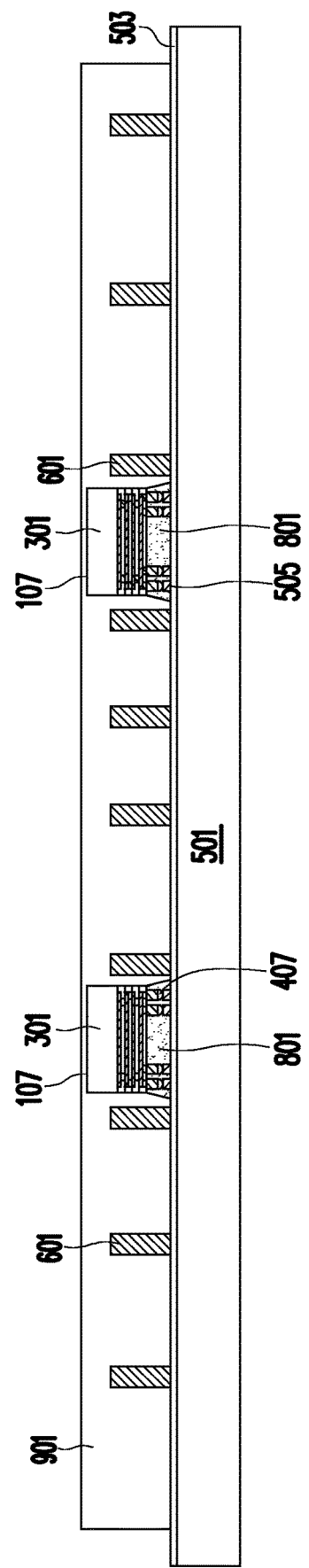

Continuing to FIG. 14, this figure illustrates an encapsulation of the local interconnects 107 and the through molding vias 601 using an encapsulant 901, in accordance with some embodiments. The encapsulation may be performed using a molding device or the encapsulant 901 may be deposited using another technique. The encapsulant 901 may be, for example, a molding compound such as epoxy molding compound (EMC), resin, polyimide, PPS, PEEK, PES, another material, the like, or a combination thereof. The encapsulant 901 may surround and/or cover the local interconnects 107 and the through molding vias 601.

Figure 15:
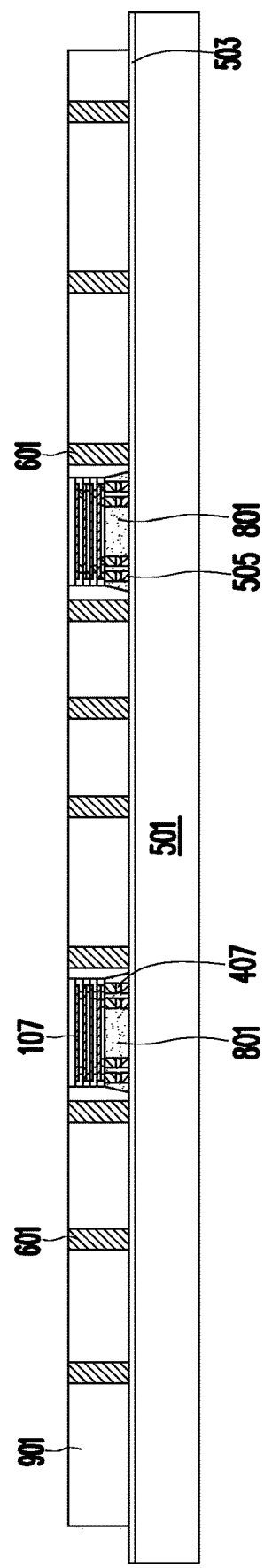

FIG. 15 illustrates a planarization process, according to some embodiments, performed on the intermediate structure illustrated in FIG. 14. The planarization process may be performed to remove excess materials from the encapsulant 901, the local interconnects 107, and/or the through molding vias 601 in accordance with some embodiments. The planarization process may be performed, e.g., using a mechanical grinding process, a chemical mechanical polishing (CMP) process, combinations, or the like. The planarization process removes excess portions of the encapsulant 901, excess materials of the carrier substrate 501 from backsides of the local interconnects 107, and/or exposes the through molding vias 601. After the planarization process, a surface of the encapsulant 901 is coplanar with surfaces of the through molding vias 601 and/or the local interconnects 107.

Figure 16:
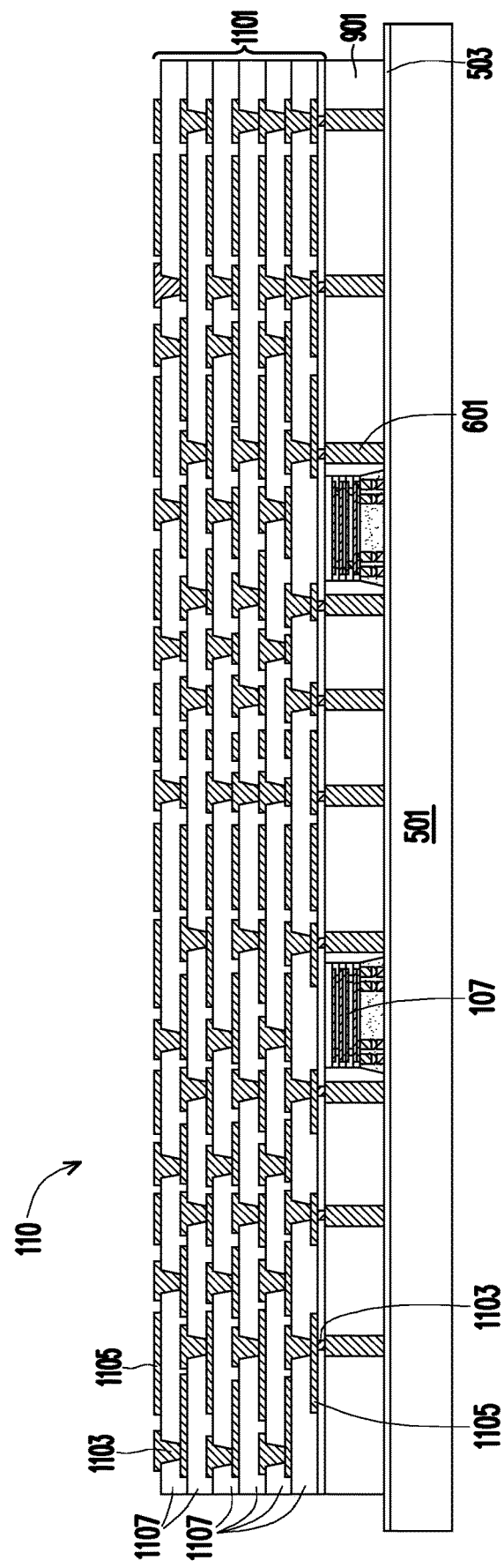

With now reference to FIG. 16, in some embodiments, a front side redistribution layer stack 1101 is formed over the coplanar surface of the encapsulant 901, the through molding vias 601, and/or the local interconnects 107. In some embodiments, the front side redistribution layer stack 1101 includes a plurality of layers of front side redistribution traces 1105, isolation layers 1107, and a plurality of conductive vias 1103 connecting the front side redistribution traces 1105 to one another through the layers of the isolation layers 1107. The front side redistribution layer stack 1101 may include any suitable number of the front side redistribution traces 1105, the isolation layers 1107, and the conductive vias 1103. According to some embodiments, the front side redistribution traces 1105 may be referred to herein as front side redistribution lines, front side conductive traces, front side conductive lines, or front side lines.

Openings may be made through the isolation layers 1107 in desired locations of the conductive vias 1103 using any of the processes (e.g., photolithographic mask and etching). However, any other suitable process (e.g., laser drilling) may also be used to form the openings in the isolation layers 1107. Once the openings have been formed in the isolation layers 1107, contact areas of the through molding vias 601 and/or contact areas at backsides of the local interconnects 107 are exposed through the openings.

According to some embodiments, the conductive vias 1103 and/or the front side redistribution traces 1105 may be formed through a deposition process such as electroplating, electroless plating, or the like. However, while the material and methods discussed are suitable to form the conductive material, these are merely examples. Any other suitable materials or any other suitable processes of formation, such as CVD or PVD.

Further layers of the isolation layers 1107, the conductive vias 1103 and/or the front side redistribution traces 1105 may be formed over one another until a desired topmost layer of the front side redistribution layer stack 1101 has been formed. As such, the through molding vias 601 are electrically coupled to the topmost layer of the conductive vias 1103 and/or the front side redistribution traces 1105 through the front side redistribution layer stack 1101.

Figure 17:
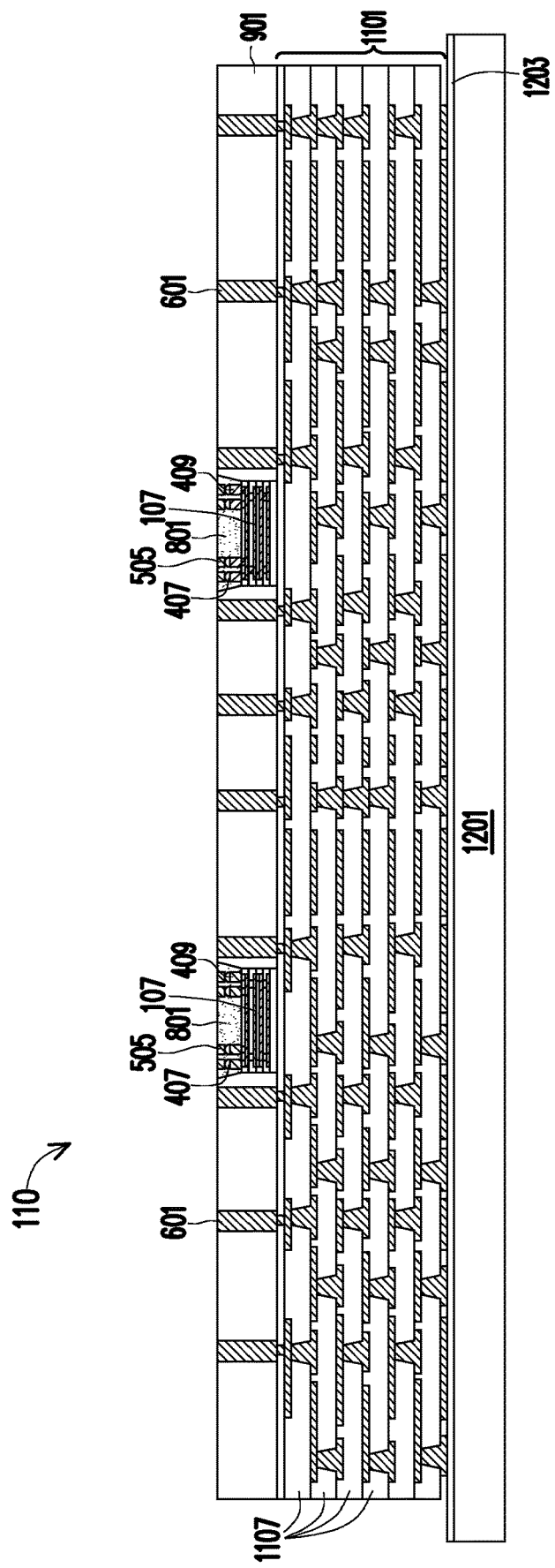

Referring to both FIG. 16 and FIG. 17, this figure illustrates the de-bonding of the carrier substrate 501 from the intermediate structure illustrated in FIG. 16 and attachment of the intermediate structure to another carrier substrate 1201. According to some embodiments, the intermediate structure is flipped over and bonded to the carrier substrate 1201 for further processing either before or after de-bonding of the second carrier substrate 501. The de-bonding includes projecting a light such as a laser light or an UV light on the release film 503 over the carrier substrate 501 so that the release film 503 decomposes under the heat of the light and the carrier substrate 501 can be removed. A release film 1203 may be formed on the carrier substrate 1201 to facilitate attachment of the front side redistribution layer stack 1101 to the carrier substrate 1201.

Figure 18:
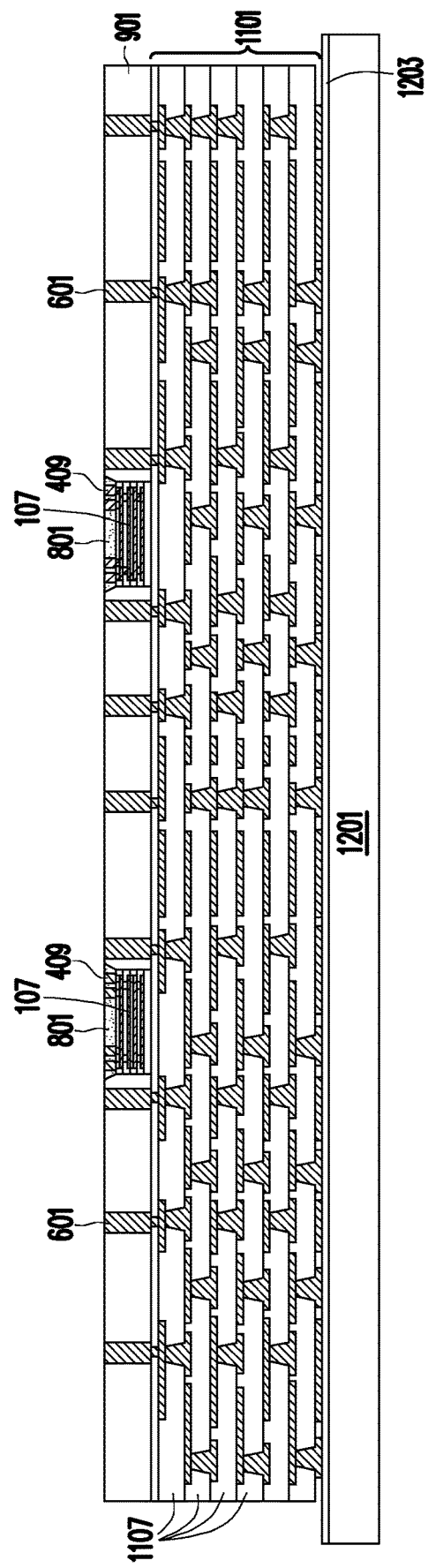

Continuing to FIG. 18, this figure illustrates a thinning process performed on the intermediate structure. The thinning process thins the intermediate structure by removing materials of the encapsulant 901, the through molding vias 601, the underfill 801, the pads 505, the external component contacts 407, and/or the UBMs 409. According to some embodiments, the pads 505 and the external component contacts 407 are removed by the thinning process and the encapsulant 901, the through molding vias 601, the underfill 801, and the UBMs 409 are planarized by the thinning process to form a coplanar surface at the front-side of the intermediate structure. The thinning process may be performed using one or more processes such as grinding, chemical mechanical planarization (CMP), wet etching, dry etching, combinations, or the like. In the embodiment illustrated in FIG. 18, the pads 505 and the external component contacts 407 are removed and the UBMs 409 are exposed at the front-side of the intermediate structure.

Figure 19:
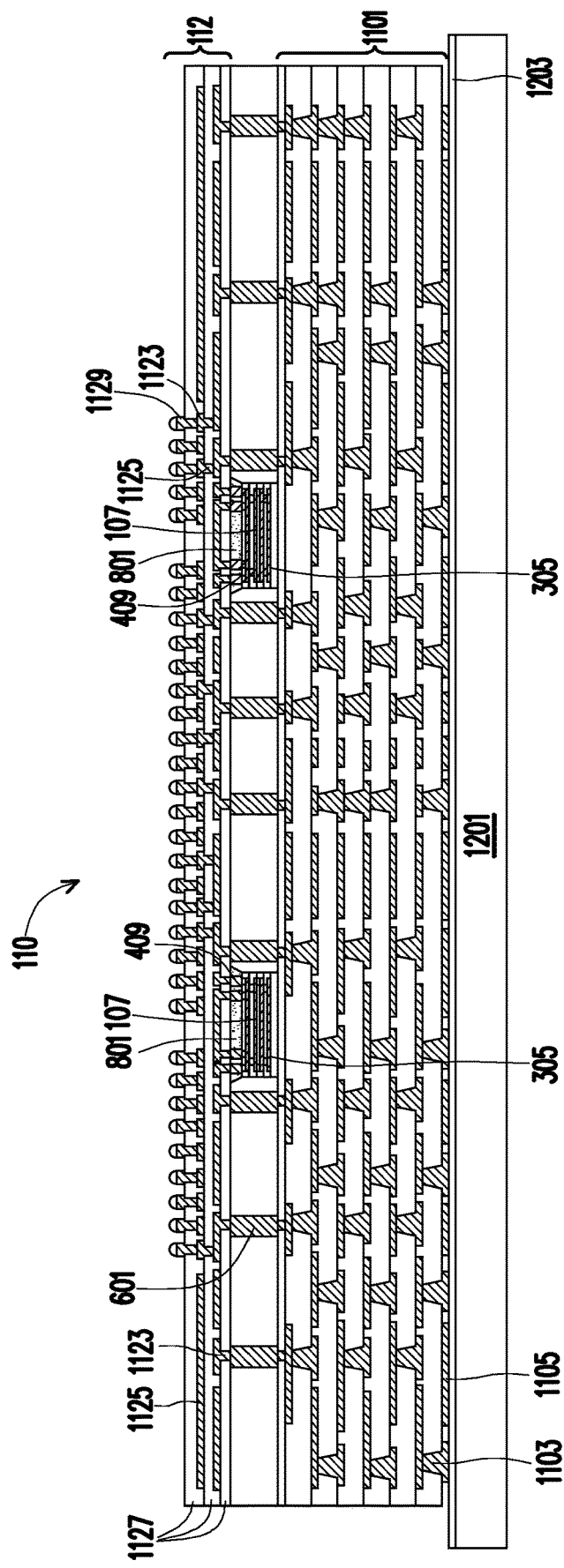

FIG. 19 illustrates the formation of a backside redistribution layer 112 for external connection to the integrated substrate structure 110 in accordance with some embodiments. In some embodiments, the backside redistribution layer 112 includes a plurality of layers of backside redistribution traces 1125, isolation layers 1127, and a plurality of conductive vias 1123 connecting the backside redistribution traces 1125 to one another through the layers of the isolation layers 1127. The backside redistribution layer 1121 may include any suitable number of the backside redistribution traces 1125, the isolation layers 1127, and the conductive vias 1123. The backside redistribution traces 1125, the isolation layers 1127, and the conductive vias 1123 may be formed using any of the materials and processes suitable for forming the front side redistribution traces 1105, the isolation layers 1107, and the conductive vias 1103, as set forth above. According to some embodiments, the backside redistribution traces 1125 may be referred to herein as backside redistribution lines, backside conductive traces, backside traces, backside conductive lines, backside lines, backside metallization layers, conductive features, or conductive lines.

According to some embodiments, the backside redistribution layer 112 is formed over the coplanar surface of the encapsulant 901, the through molding vias 601, the underfill 801, the UBMs 1129. Once the first layer of the conductive vias 1123 and/or the first layer of the backside redistribution traces 1125 have been formed, further layers of the isolation layers 1127, the conductive vias 1123 and/or the backside redistribution traces 1125 may be formed over one another until a desired topmost layer of the backside redistribution layer 1121 has been formed. At this point, an integrated substrate structure 110 may be substantially formed.

In some embodiments, once the topmost layer of the third isolation layers 1127 has been formed, under-bump metallizations (UBMs) 1129, solder layers 132, and solder balls 134 are formed on the backside redistribution layer 1121, in accordance with some embodiments. In some embodiments, the UBMs 1129 extend through the topmost layer of the isolation layers 1127 and form electrical connections with the conductive vias 1123 and/or the backside redistribution traces 1125. In some embodiments, the UBMs 1129 may include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 1129. Any suitable materials or layers of material that may be used for the UBMs 1129 are fully intended to be included within the scope of the current application. The conductive materials of the UBMs 1129 may be formed using one or more plating processes, such as electroplating or electroless plating processes, although other processes of formation, such as sputtering, evaporation, or a PECVD process, may also be used.

In some embodiments, the solder layers 132 and the solder balls 134 described in FIG. 1 to FIG. 5 may be formed over the UBMs 1129, in accordance with some embodiments. In some embodiments, the amount of indium contained in the solder layer 132 and/or the solder ball 134 is adjusted, so that the solder joint structure 130 subsequently formed by reflowing the solder layer 132 and the solder ball 134 together includes 2% to 23% of indium, by weight percent. The solder layer 132 and the solder ball 134 may further include other conductive material such as solder, copper, aluminum, gold, nickel, silver, palladium, tin, bismuth, the like, or a combination thereof. As such, according to some embodiments, the local interconnects 107 electrically couple two or more of the external device connectors 1411 to one another. According to some embodiments, the through molding vias 601 electrically couple the solder layers 132 and the solder balls 134 at one side of the integrated substrate structure 110 to the front side redistribution traces 1105 at the opposite side of the integrated substrate structure 110.

It is noted that the integrated substrate structure 110 is manufactured in a wafer form process according to some embodiments. FIG. 13 to FIG. 19 illustrate one of the units in the wafer forming process, which utilizes a circular wafer to form a plurality of the integrated substrate structure 110. According to some embodiments, a plurality of the integrated substrate structure 110 may be formed using wafer level processing techniques, and later singulated into the individual structures. According to some embodiments, a plurality of integrated substrate structures 110 are formed on the carrier substrate 1201. Once formed, the panel structure may be further processed and subsequently singulated into individual structures of the integrated substrate structure 110. Once singulated, the integrated substrate structures 110 may be used in forming packaged devices. In some embodiments, the integrated substrate structures 110 may remain in wafer or panel form during further processing (e.g., wafer to wafer bonding and/or wafer level packaging).

Figure 20:
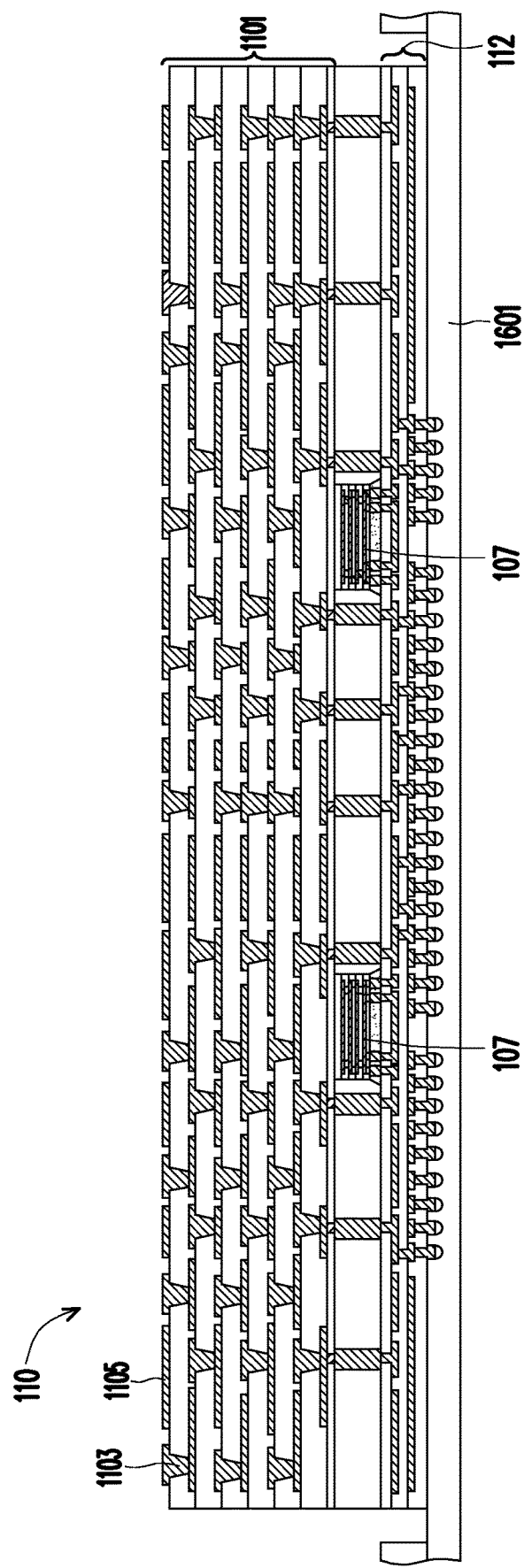

Referring to both FIG. 19 and FIG. 20, the integrated substrate structures 110 is then de-bonded from the carrier substrate 1201 and attached to a carrier tape 1601 (e.g., a blue tape, UV film, or the like). According to some embodiments, the integrated substrate structure 110 is flipped over and bonded to the carrier tape 1601 either before or after de-bonding of the carrier substrate 1201 for further processing. The carrier substrate 1201 may be de-bonded similar to the processes used to remove any of the carrier substrates, as set forth above. For example, the carrier substrate 1201 may be de-bonded by projecting a light on the release film 1203 so that the release film 1203 decomposes under the heat of the light and the carrier substrate 1201 can be removed. The integrated substrate structure 110 may be flipped over and attached to the carrier tape 1601 either before or after de-bonding. The carrier tape 1601 provides both adhesion and protection for the attached surfaces of the backside redistribution layer 112 and allows for further processing at the backside of the integrated substrate structure 110. In some embodiments, the wafer or panel of the integrated substrate structures 110 may be flipped over and bonded to the carrier tape 1601 for further processing.

FIG. 21 illustrates the attachment of an interconnect structure 120 to the integrated substrate structure 110. The interconnect structure 120 provides additional routing and stability to the integrated substrate structure 110. For example, the interconnect structure 120 can reduce warping of the integrated substrate structure 110, especially for interconnect structures 120 having large areas (e.g., greater than about 70 mm$^2$).

In some embodiments, the interconnect structure 120, in accordance with some embodiments, may be, for example, an interposer or a "semi-finished substrate," and may be free of active devices. In some embodiments, the interconnect structure 120 includes routing layers formed on a core substrate 1701. The core substrate 1701 may include a material such as Ajinomoto build-up film (ABF), a pre-impregnated composite fiber (prepreg) material, an epoxy, a molding compound, an epoxy molding compound, fiber-glass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 1701 may be a double-sided copper-clad laminate (CCL) substrate or the like.

The interconnect structure 120 may have one or more routing structures 1703 formed on each side of the core substrate 1701 and through vias 1705 extending through the core substrate 1701. The routing structures 1703 and through vias 1705 provide additional electrical routing and interconnection. The routing structures 1703 may include one or more routing layers 1707 and one or more interlayer dielectric layers 1709. In some embodiments, the routing layers 1707 and/or through vias 1705 may include one or more layers of copper, nickel, aluminum, other conductive materials, the like, or a combination thereof. In some embodiments, the interlayer dielectric layers 1709 may be include materials such as a build-up material, ABF, a prepreg material, a laminate material, another material similar to those described above for the core substrate 1701, the like, or combinations thereof. Although the illustrated embodiment of the interconnect structure 120 includes two of the routing structures 1703 and each of the routing structures 1703 includes four of the routing layers 1707, the routing structures 1703 may include more or fewer than four of the routing layers 1707. According to some embodiments, one of the routing structures 1703 may include more of the routing layers 1707 than the other one of the routing structures 1703.

In some embodiments, the through vias 1705 may include via cores 1711 surrounded by conductive material. The via core 1711 may be a filler material that provides structural support and protection for the conductive material of the through vias 1705. In some embodiments, the filler material may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material may include pigments or dyes (e.g., for color), or other fillers and additives that modify rheology, improve adhesion, or affect other properties of the via cores 1711. In some embodiments, the conductive material of the through vias 1705 may completely fill the through vias 1705, omitting the filler material.

In some embodiments, the interconnect structure 120 may include a passivation layer 1713 formed over one or more sides of the interconnect structure 120. The passivation layer 1713 may be a material such as a nitride, an oxide, a polyimide, a low-temp polyimide, a solder resist, combinations thereof, or the like. Once formed, the passivation layer 1713 may be patterned (e.g., using a suitable photolithographic and etching process) to expose portions of the routing layers 1707.

FIG. 21 further illustrates a placement of the interconnect structure 120 into electrical connection with the integrated substrate structure 110, in accordance with some embodiments. In an embodiment, the interconnect structure 120 is placed into physical contact with solder joint structure 130

(e.g., solder layers and solder balls) that have been placed on the integrated substrate structure 110. The interconnect structure 120 may be placed using, e.g., a pick and place process. In accordance with some embodiments of the disclosure, the bonding method illustrated in FIG. 1 to FIG. 5 can be applied to the bonding of the interconnect structure 120 to the integrated substrate structures 110. For example, the integrated substrate structures 110 may be analogous as the substrate 110 shown in FIG. 1 to FIG. 5, while the interconnect structure 120 may be analogous as the semiconductor device 120 shown in FIG. 1 to FIG. 5.

Accordingly, the interconnect structure 120 are attached to the contact pads 114 at the front side of the integrated substrate structures 110. The interconnect structure 120 are interfaces for external connection to the semiconductor package 100 (e.g., a system on integrated substrate (SoIS) package). The interconnect structure 120 include pads 122, such as aluminum pads, to which external connections are made. The interconnect structure 120 are mounted to the contact pads 114 of the integrated substrate structures 110 using the solder joint structures 130 (including solder layers 132 and solder balls 134). For purpose of clarity and simplicity, detail description of same or similar features for the interconnect structure 120 being bonded to the integrated substrate structures 110 through the solder joint structures 130 is omitted herein. With such bonding arrangement, the amount of indium contained in the solder layer and/or the solder ball is adjusted to a point that the solder joint structure 130 includes 2% to 23% of indium by weight percent. In accordance with some embodiments of the disclosure, having 2% to 23% of indium, by weight percent, distributed in the solder joint structure 130 allows the solder joint structure 130 to be reflowed under a lower reflow temperature, so as to have better thermal cycle properties and less warpage in a large scale package such as a system on integrated substrate (SoIS) package 100. Meanwhile, during operation, the solder joint structure 130 can remain in solid state at such reflow temperature since the melting point of the solder joint structure 130 is increased by mixing indium with other solder material (e.g., SAC ball). Accordingly, having 2% to 23% of indium, by weight percent, distributed in the solder joint structure 130 contributes to better electro-migration, robust thermal cycle properties and favorable thermal endurance compared to the case where no indium is present in the solder joint structure 130.

Once the integrated substrate structure 110 and the interconnect structure 120 have been bonded together by the solder joint structure 130, the interconnect structure 120 provides extra routing for the integrated substrate structure 110. According to some embodiments, contact pads that face away from the integrated substrate structure 110 are electrically coupled through the interconnect structure 120 and the solder joint structure 130 to the integrated substrate structure 110.

Referring to FIG. 21, once the interconnect structure 120 has been attached, a device redistribution module 1800 may be formed by initially depositing a underfill 1801 over the carrier tape 1601, along the sidewalls of the integrated substrate structure 110, along the sidewalls of the interconnect structure 120, and in the gap between the interconnect structure 120 and the integrated substrate structure 110. Examples of the underfill 1801 include, but are not limited to, underfill materials such as an exposed molded underfill (eMUF), an underfill combined with an exposed molding compound, a dispensable molded underfill, molding compound, an epoxy, a resin, combinations, or the like. The underfill 1801 can protect the external structure connectors 1715 and provide structural support for the integrated substrate structure 110. In some embodiments, the underfill 1801 may be cured after deposition and/or may be thinned after deposition. The thinning may be performed, e.g., using a mechanical grinding or CMP process. In some embodiments, the underfill 1801 may be deposited over the routing structures 1703 facing away from the integrated substrate structure 110, the thinning may expose the topmost layer of the passivation layer 1713 facing away from the integrated substrate structure 110, and an etching process in order to expose the routing layers 1707.

In embodiments in which the interconnect structures 120 are bonded to the integrated substrate structures 110 when the integrated substrate structures 110 are part of a wafer or panel, the underfill 1801 may be formed prior to singulation of the structures into a plurality of the device redistribution modules 1800, resulting in the underfill 1801 being planar with the integrated substrate structures 110. In embodiments in which the interconnect structures 120 remain in wafer or panel form and are attached to the wafer or panel of the integrated substrate structures 110 in a wafer to wafer process, the device redistribution module 1800 may be formed by initially singulating the structure into discrete components and forming the second underfill 1801 over one or both of the discrete components. Any suitable combination of steps may be utilized.

Referring to FIG. 22 and FIG. 23, the device redistribution module 1800 is singulated and de-mounted from the carrier tape 1601 and a plurality of the semiconductor devices 108 are then placed over the integrated substrate structures 110 of the device redistribution module 1800, in accordance with some embodiments. Once removed from the carrier tape 1601, the structure may be flipped over and singulated (e.g., via wafer sawing, laser drilling, etching, combinations, or the like) into a plurality of the device redistribution modules 1800.

In some embodiments, the semiconductor devices 108 are placed via a pick and place process over the external device connector 1411. The semiconductor devices 108 may be placed after singulation of the device redistribution module 1800 from the wafer. However, in other embodiments, the semiconductor devices 108 may also be placed and then attached prior to singulation of the wafer. The semiconductor devices 108 may include devices such as system dies 104 (e.g., system-on-chip (SoC)), memory dies 103 (e.g., high-bandwidth memory (HBM)), and input/output dies 105 (e.g., I/O chips). In some embodiments, the system dies 104, the memory dies 103, and the input/output dies 105 may be arranged in any suitable pattern and the local interconnects 107 may be connected between any suitable combination of adjacent ones of the system dies 104, the memory dies 103, and the input/output dies 105.

The semiconductor devices 108 may be placed such that external contacts 1901 (e.g., contact pads, conductive connectors, solder bumps, or the like) of the semiconductor devices 108 are aligned with corresponding ones of the external device connectors 1411. Once in physical contact, a reflow process may be utilized to bond the external contacts 1901 of the semiconductor devices 108 to the integrated substrate structures 110 of the device redistribution module 1800. In some embodiments, the external device connectors 1411 are formed on the external contacts 1901 of the semiconductor devices 120 instead of or in addition to the external device connectors 1411 being formed on the integrated substrate structure 110.

In accordance with some embodiments of the disclosure, the bonding method illustrated in FIG. 1 to FIG. 5 can be applied to the bonding of the semiconductor devices 108 to the integrated substrate structures 110. For example, the integrated substrate structures 110 may be analogous as the substrate 110 shown in FIG. 1 to FIG. 5, while the semiconductor devices 108 (e.g., semiconductor devices 104, 103, 105) may be analogous as the semiconductor device 120 shown in FIG. 1 to FIG. 5.

Accordingly, the semiconductor devices 108 are attached to the contact pads at the front side of the integrated substrate structures 110. The semiconductor devices 108 are interfaces for external connection to the semiconductor package 100 (e.g., a system on integrated substrate (SoIS) package). The semiconductor devices 108 include external contacts 1901, such as aluminum pads, to which external connections are made. The semiconductor devices 108 are mounted to the contact pads of the integrated substrate structures 110 using the external device connectors 1411 (including solder layers and solder balls). For purpose of clarity and simplicity, detail description of same or similar features for the semiconductor devices 108 being bonded to the integrated substrate structures 110 through the external device connectors 1411 is omitted herein. With such bonding arrangement, the amount of indium contained in the solder layer and/or the solder ball is adjusted to a point that the external device connectors 1411 may include 2% to 23% of indium by weight percent. In accordance with some embodiments of the disclosure, having 2% to 23% of indium, by weight percent, distributed in the external device connectors 1411 allows the solder joint structure 130 to be reflowed under a lower reflow temperature, so as to have better thermal cycle properties and less warpage in a large scale package such as a system on integrated substrate (SoIS) package 100. Meanwhile, during operation, the external device connectors 1411 can remain in solid state at such reflow temperature since the melting point of the external device connectors 1411 is increased by mixing indium with other solder material (e.g., SAC ball). Accordingly, having 2% to 23% of indium, by weight percent, distributed in the external device connectors 1411 contributes to better electro-migration, robust thermal cycle properties and favorable thermal endurance compared to the case where no indium is present in the external device connectors 1411.

Referring to FIG. 23, in some embodiments, once bonded, an underfill material 2001 may be deposited between each of the semiconductor devices 108 and the integrated substrate structures 110 according to some embodiments. The underfill material 2001 may also at least partially surround the external device connectors 1411. The underfill material 2001 may be a material such as a molding compound, an epoxy, an underfill, a molding underfill (MUF), a resin, or the like, and may be similar to any of the other underfills described above. In some cases, the semiconductor devices 108 are at least partially connected to each other by the local interconnects 107.

Once the underfill material 2001 has been formed, in embodiments where the semiconductor devices 108 are attached prior to singulation, the wafer may be singulated. In some embodiments, the wafer may be singulated into a plurality of the semiconductor packages 100 prior to forming the external package connectors 2003, although the wafer may also be singulated after forming the external package connectors 2003.

Once the underfill material 2001 has been formed, the external package connectors 2003 may be formed at the backside of the semiconductor package 100. The external package connectors 2003 may be formed on exposed portions of the topmost layer of the routing layers 1707 facing away from the integrated substrate structure 110. These exposed portions of the topmost layer may be referred to herein as external contact pads of the interconnect structure 120. The external package connectors 2003 may be, for example, contact bumps or solder balls, although any suitable types of connectors may be utilized. In an embodiment in which the external package connectors 2003 are contact bumps, the external package connectors 2003 may include a material such as tin, or other suitable materials, such as silver, lead-free tin, or copper. In an embodiment in which the external package connectors 2003 are solder bumps, the external package connectors 2003 may be formed by initially forming a layer of solder in desired locations of the external package connectors 2003 using such a technique such as evaporation, electroplating, printing, solder transfer, ball placement, etc. Once the layer of solder has been formed in the desired locations, a reflow may be performed in order to shape the material into the desired bump shape for the external package connectors 2003. In some embodiments, the external package connectors 2003 may be similar to the external structure connectors 1715 described above and/or the solder joint structure 130.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a substrate, a semiconductor device over the substrate and a plurality of solder joint structures bonded between the semiconductor device and the substrate, wherein each of the plurality of solder joint structures includes, by weight percent, 2% to 23% of Indium (In). In an embodiment, the semiconductor package further includes an underfill material disposed between the semiconductor device and the redistribution structure, and at least partially encapsulating the plurality of solder joint structures. In an embodiment, the plurality of solder joint structures includes a plurality of central solder joint structures and a plurality of peripheral solder joint structures surrounding the plurality of central solder joint structures, and the underfill material encapsulates outer surfaces of the plurality of peripheral solder joint structures. In an embodiment, the plurality of central solder joint structures are free of encapsulation of the underfill material. In an embodiment, each of the plurality of solder joint structures includes at least one element selected from Bi, Ag, and Cu. In an embodiment, the semiconductor device includes a first type of a first semiconductor device and a second type of a second semiconductor device, and the first type is different from the second type. In an embodiment, the substrate includes a system on wafer device or an integrated substrate structure.

In accordance with some embodiments of the disclosure, a semiconductor package includes a substrate, a redistribution structure over the substrate, a plurality of semiconductor devices over the substrate, a plurality of solder joint structures bonded between the plurality of semiconductor devices and the redistribution structure, and an underfill material disposed between the plurality of semiconductor devices and the redistribution structure, and at least encapsulating outermost ones of the plurality of solder joint structures. Each of the plurality of solder joint structures includes, by weight percent, 2% to 23% of In (Indium). In an embodiment, each of the plurality of solder joint structures includes at least one element selected from Bi, Ag, and Cu. In an embodiment, the plurality of semiconductor devices includes a power module and a connector. In an embodiment, the substrate includes a plurality of semiconductor devices located at least partially within the substrate and electrically connected to the redistribution structure. In an embodiment, the semiconductor package further includes a thermal module, wherein the substrate is disposed over and thermally coupled to the thermal module. In an embodiment, the plurality of semiconductor devices includes a system die and a memory die. In an embodiment, the substrate includes an integrated substrate structure.

In accordance with some embodiments of the disclosure, a manufacturing method of a semiconductor package includes the following steps. A substrate is provided. A solder layer and a solder ball are provided over the substrate, wherein one of the solder layer and the solder ball includes In. A semiconductor device is provided over the substrate. A reflow process is performed on the solder layer and the solder ball to form a solder joint structure bonded between the substrate and the semiconductor device, wherein the solder joint structure includes, by weight percent, 2% to 23% of In. In an embodiment, performing the reflow process further includes the following steps: a first reflow process is performed with a first process temperature for melting the one of the solder layer and the solder ball comprising In; and a second reflow process is performed with a second process temperature higher than the first process temperature for melting rest of the solder layer and the solder ball. In an embodiment, the first process temperature ranges from 120° C. to 224° C. In an embodiment, the second process temperature ranges from 220° C. to 260° C. In an embodiment, the manufacturing method of the semiconductor package further includes: before the second reflow process is performed, an underfill material is provided between the semiconductor device and the redistribution structure, wherein the underfill material at least partially encapsulates the solder layer and the solder ball. In an embodiment, a weight ratio of the solder layer to the solder ball ranges from 0.1 to 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a substrate;
a plurality of semiconductor devices over the substrate; and
a plurality of solder joint structures bonded between the semiconductor device and the substrate, wherein the plurality of solder joint structures comprise a plurality of central solder joint structures and a plurality of peripheral solder joint structures surrounding the plurality of central solder joint structures; and
an underfill material disposed between the semiconductor device and the substrate and partially encapsulating the plurality of solder joint structures, wherein the plurality of central solder joint structures are free of encapsulation of the underfill material.

2. The semiconductor package as claimed in claim 1, wherein the underfill material encapsulates outer surfaces of the plurality of peripheral solder joint structures.

3. The semiconductor package as claimed in claim 1, wherein each of the plurality of solder joint structures comprises Bi.

4. The semiconductor package as claimed in claim 1, wherein the semiconductor device comprises an interconnect structure or a plurality of semiconductor dies.

5. The semiconductor package as claimed in claim 1, wherein the substrate comprises a plurality of functional dies formed therein and a redistribution structure over the plurality of functional dies, the redistribution structure comprises a plurality of local interconnects electrically coupling the plurality of functional dies.

6. A semiconductor package, comprising:
a semiconductor wafer comprising a substrate, a plurality of functional dies formed therein and a redistribution structure over the substrate, wherein the redistribution structure comprises a plurality of local interconnects electrically coupling the plurality of functional dies;
a plurality of semiconductor devices over the semiconductor wafer; and
a plurality of solder joint structures bonded between the plurality of semiconductor devices and the semiconductor wafer and
an underfill material disposed between the plurality of semiconductor devices and the substrate, and at least encapsulating outermost ones of the plurality of solder joint structures.

7. The semiconductor package as claimed in claim 6, wherein each of the plurality of solder joint structures comprises Bi.

8. The semiconductor package as claimed in claim 6, wherein the plurality of semiconductor devices comprises a power module and a connector.

9. The semiconductor package as claimed in claim 6, further comprising a thermal module disposed over and thermally coupled to a backside of the semiconductor wafer.

10. The semiconductor package as claimed in claim 9, further comprises a plurality of screw assemblies configured to fasten the thermal module to the substrate.

11. The semiconductor package as claimed in claim 6, wherein the semiconductor wafer comprises a system on wafer device.

12. The semiconductor package as claimed in claim 6, wherein the underfill material encapsulates vertical side surfaces of the interconnect structure while vertical side surfaces of the substrate is free of encapsulation of the underfill material.

13. The semiconductor package as claimed in claim 6, wherein the semiconductor wafer further comprises a backside redistribution structure disposed on a backside of the substrate opposite to a front side of the substrate where the redistribution structure is disposed.

14. The semiconductor package as claimed in claim 6, wherein the redistribution structure is electrically connecting a first multiple of the plurality of functional dies, and the backside redistribution structure electrically connecting a second multiple of the plurality of functional dies.

15. The semiconductor package as claimed in claim 6, further comprising an underfill material disposed between the plurality of semiconductor devices and the semiconductor wafer, wherein the underfill material encapsulates outermost ones of the plurality of solder joint structures and center ones of the plurality of solder joint structures are free of encapsulation of the underfill material.

16. A manufacturing method of a semiconductor package, comprising:
   providing a substrate;
   providing a solder layer and a solder ball over the substrate, wherein one of the solder layer and the solder ball comprises In;
   providing a semiconductor device over the substrate;
   performing a reflow process on the solder layer and the solder ball to form a solder joint structure bonded between the substrate and the semiconductor device, wherein the solder joint structure comprises, by weight percent, 2% to 23% of In, wherein the reflow process comprises:
      performing a first reflow process with a first process temperature for melting the one of the solder layer and the solder ball comprising In; and
      performing a second reflow process with a second process temperature higher than the first process temperature for melting rest of the solder layer and the solder ball.

17. The manufacturing method of the semiconductor package as claimed in claim 16, wherein the first process temperature ranges from 120° C. to 224° C.

18. The manufacturing method of the semiconductor package as claimed in claim 16, wherein the second process temperature ranges from 220° C. to 260° C.

19. The manufacturing method of the semiconductor package as claimed in claim 16, further comprising:
   before the second reflow process is performed, providing an underfill material between the semiconductor device and the redistribution structure, wherein the underfill material at least partially encapsulates the solder layer and the solder ball.

20. The manufacturing method of the semiconductor package as claimed in claim 16, wherein a weight ratio of the solder layer to the solder ball ranges from 0.1 to 1.

* * * * *